US008291279B2

(12) United States Patent
Sharon et al.

(10) Patent No.: US 8,291,279 B2
(45) Date of Patent: Oct. 16, 2012

(54) MEMORY-EFFICIENT LDPC DECODER AND METHOD

(75) Inventors: Eran Sharon, Rishon Letzion (IL); Simon Litsyn, Givat Shmuel (IL); Idan Alrod, Tel Aviv (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 1093 days.

(21) Appl. No.: 12/124,192

(22) Filed: May 21, 2008

(65) Prior Publication Data
US 2008/0294960 A1 Nov. 27, 2008

Related U.S. Application Data

(60) Provisional application No. 60/939,092, filed on May 21, 2007.

(51) Int. Cl.
*H03M 13/00* (2006.01)
(52) U.S. Cl. ........................................ 714/752; 714/801
(58) Field of Classification Search .................. 714/752, 714/801
See application file for complete search history.

(56) References Cited

U.S. PATENT DOCUMENTS

| | | | |
|---|---|---|---|
| 6,789,227 B2 | 9/2004 | De Souza et al. | |
| 7,036,720 B2 | 5/2006 | Mezard et al. | |
| 7,178,081 B2 * | 2/2007 | Lee et al. | 714/752 |
| 7,552,097 B2 * | 6/2009 | Richardson et al. | 706/15 |
| 7,562,279 B2 * | 7/2009 | Zhang et al. | 714/752 |
| 7,571,375 B2 * | 8/2009 | Kim et al. | 714/786 |
| 7,783,952 B2 * | 8/2010 | Nimbalker et al. | 714/755 |
| 7,886,208 B2 * | 2/2011 | Moon et al. | 714/752 |
| 2005/0180459 A1 | 8/2005 | Watson | |
| 2005/0193320 A1 | 9/2005 | Varnica et al. | |
| 2005/0204271 A1 | 9/2005 | Sharon et al. | |
| 2005/0229087 A1 | 10/2005 | Kim et al. | |
| 2006/0136799 A1 | 6/2006 | Choi et al. | |
| 2007/0033482 A1 | 2/2007 | Seki | |
| 2007/0162815 A1 | 7/2007 | El-Khamy et al. | |
| 2008/0028274 A1 | 1/2008 | Lin | |
| 2008/0028281 A1 | 1/2008 | Miyazaki et al. | |

OTHER PUBLICATIONS

R.G. Gallager, *Low-Density Parity Check Codes*, Cambridge, MA: MIT Press, 1963.
Bhatt, T. et al., *Pipelined Block-Serial Decoder Architecture for Structured Ldpc Codes*, Proc. Acoustics, Speech and Signal Processing 2006 (ICASSP 2006), Jan. 1, 2006, pp. IV-225-IV-228. Mansour, M. M. et al., *Turbo Decoder Architectures for Low-Density Parity-Check Codes*, Proc. IEEE Global Telecommunications Conference, vol. 2, Nov. 17, 2002, pp. 1383-1388.
International Search Report and Written Opinion for Application No. PCT/IL2008/000685 dated Dec. 23, 2008.
International Preliminary Report on Patentability for Application No. PCT/IL2008/000685 dated Nov. 24, 2009.

* cited by examiner

*Primary Examiner* — Esaw Abraham
(74) *Attorney, Agent, or Firm* — Alston & Bird LLP

(57) ABSTRACT

To decode a representation of a codeword that encodes K information bits as N>K codeword bits, messages are exchanged between N bit nodes and N−K check nodes of a graph in which E edges connect the bit nodes and the check nodes. While messages are exchanged, fewer than E of the messages are stored, and/or fewer than N soft estimates of the codeword bits are stored. In some embodiments, the messages are exchanged only within sub-graphs and between the sub-graphs and one or more external check nodes. While messages are exchanged, the largest number of stored messages is the number of edges in the sub-graph with the most edges plus the number of edges that connect the sub-graphs to the external check node(s), and/or the largest number of stored soft estimates is the number of bit nodes in the sub-graph with the most bit nodes.

34 Claims, 13 Drawing Sheets

Initialization:
for all $c \in C, v \in N(c, G)$     $R_{cv} \leftarrow 0$

Iteration:
for all $v \in V$     (Compute bit to check messages)
    for all $c \in N(v, G)$
        $Q_{vc} \leftarrow P_v + \sum_{c' \in N(v,G) \setminus c} R_{c'v}$
    end of loop
end of loop
for all $c \in C$     (Compute check to bit messages)
    for all $v \in N(c, G)$
        $R_{cv} \leftarrow \varphi^{-1} \left( \sum_{v' \in N(c,G) \setminus v} \varphi(Q_{v'c}) \right)$
    end of loop
end of loop
for all $v \in V$     (update final bit estimates)
    $Q_v \leftarrow P_v + \sum_{c \in N(v,G)} R_{cv}$
end of loop

Stop Criteria:
for all $v \in V$ $\hat{v} = sign(Q_v)$
*if* $H \cdot \underline{\hat{v}} = 0$, stop
*else, continue to next iteration*

FIGURE 2 (PRIOR ART)

Initialization:
for all $v \in V, c \in C \quad R_{cv} \leftarrow 0$
for all $v \in V \quad Q_v \leftarrow P_v$

Iteration:
for all $c \in C$                  (Serially traversing the check nodes)
$\quad S \leftarrow \sum_{v \in N(c,G)} \varphi(Q_v - R_{cv})$
$\quad$ for all $v \in N(c,G)$
$\quad\quad Q_{vc} \leftarrow Q_v - R_{cv}$          (Sending $Q_{vc}$ messages into the check nodes)
$\quad\quad R_{cv} \leftarrow \varphi^{-1}(S - \varphi(Q_{vc}))$    (Sending $R_{cv}$ messages out from the check nodes)
$\quad\quad Q_v \leftarrow Q_{vc} + R_{cv}$          (updating *a-posteriori* LLRs)
$\quad$ end of loop
end of loop

Stop Criteria:
for all $v \in V \; \hat{v} = sign(Q_v)$
if $H \cdot \hat{v} = 0$, stop
else, *continue to next iteration*

FIGURE 3 (PRIOR ART)

Decoding phases:

for all $c \in C_J, v \in N(c,G)$: $Q_{vc} = P_v$ for all $i \in \{1,...,t\}$: (go over sub-graphs)

Sub-graph initialization:
   for all $v \in V_i, c \in C_i$:    $R_{cv} \leftarrow 0$
   for all $v \in V_i$:          $Q_v \leftarrow P_v = function(y_v)$
   for all $v \in V_i, c \in C_J$:    $R_{cv} \leftarrow \varphi^{-1}\left(\sum_{v' \in N(c,G)\backslash v} \varphi(Q_{v'c})\right)$    (exchange inter sub-graph information)

Sub-graph $(i)$ iterations:
   for all $c \in C_i$: (go over sub-graph check nodes)
     Check node processing (send messages to and from check node):
     $S \leftarrow \sum_{v \in N(c,G_i)} \varphi(Q_v - R_{cv})$
     for all $v \in N(c,G_i)$:
        $Q_{temp} \leftarrow Q_v - R_{cv}$
        $R_{cv} \leftarrow \varphi^{-1}\left(S - \varphi(Q_{temp})\right)$
        $Q_v \leftarrow Q_{temp} + R_{cv}$
     end of loop
   end of check nodes loop
end of iteration loop

Sub-Graph Stop Criteria:
for all $v \in V_i$ : $\hat{v} = sign(Q_v)$
if $H_i \cdot \hat{v} = 0$ or maximal number of iterations is reached, stop
$H_i \triangleq$ the parity-check matrix corresponding to sub-graph $G_i$
else, continue to next iteration

Sub-graph termination:
for all $v \in V_i, c \in C_J$:    $Q_{vc} \leftarrow P_v + \sum_{c' \in N(v,G)\backslash c} R_{c'v}$    (exchange inter sub-graph information)
end of sub-graphs loop

Stop Criteria:
for all $v \in V$ $\hat{v} = sign(Q_v)$
if $H \cdot \hat{v} = 0$ or maximal number of phases, then stop
$H \triangleq$ the parity-check matrix corresponding to graph $G$
else, continue to next phase
end of phases loop

FIGURE 6

MEMORY-EFFICIENT LDPC DECODER AND METHOD

This patent application claims the benefit of U.S. Provisional Patent Application No. 60/939,092, filed May 21, 2007.

FIELD AND BACKGROUND OF THE INVENTION

Disclosed herein is a low complexity decoder, for Low-Density Parity Check (LDPC) codes, that allows implementing very long LDPC codes exhibiting near optimal performance with low complexity decoding hardware.

Error Correction Codes (ECCs) are commonly used in communication systems and in storage systems. Various physical phenomena occurring both in communication channels and in storage devices result in noise effects that corrupt the communicated or stored information. Error correction coding schemes can be used for protecting the communicated or stored information against the resulting errors. This is done by encoding the information before transmission through the communication channel or storage in the memory device. The encoding process transforms the information bits sequence into a codeword by adding redundancy to the information. This redundancy can then be used in order to recover the information from the possibly corrupted codeword through a decoding process.

In both communication systems and storage systems an information bit sequence $\underline{i}$ is encoded into a coded bit sequence $\underline{v}$ that is modulated or mapped into a sequence of symbols $\underline{x}$ that is adapted to the communication channel or to the memory device. At the output of the communication channel or memory device a sequence of symbols $\underline{y}$ is obtained. An ECC decoder of the system decodes the sequence $\underline{y}$ and recovers the bit sequence $\underline{\hat{i}}$, which should reconstruct the original information bit sequence $\underline{i}$ with high probability.

A common ECC family is the family of linear binary block codes. A length N linear binary block code of dimension K is a linear mapping of length K information bit sequences into length N codewords, where N>K. The rate of the code is defined as R=K/N. The encoding process of a codeword $\underline{v}$ of dimension 1×N is usually done by multiplying the information bits sequence $\underline{i}$ of dimension 1×K by a generator matrix G of dimension K×N according to $$\underline{v} = \underline{i} \cdot G \qquad (1)$$

It is also customary to define a parity-check matrix H of dimension M×N, where M=N−K. The parity-check matrix is related to the generator matrix through the following equation:

$$GH^T = 0 \qquad (2)$$

The parity-check matrix can be used in order to check whether a length N binary vector is a valid codeword. A 1×N binary vector $\underline{v}$ belongs to the code if and only if the following equation holds:

$$H \cdot \underline{v}' = 0 \qquad (3)$$

(In equation (3), the prime on $\underline{v}'$ means that $\underline{v}'$ is a column vector.)

In recent years iterative coding schemes have become very popular. In these schemes the code is constructed as a concatenation of several simple constituent codes and is decoded using an iterative decoding algorithm by exchanging information between the constituent decoders of the simple codes. Usually, the code can be defined using a bipartite graph describing the interconnections between the constituent codes. In this case, decoding can be viewed as an iterative message passing over the graph edges.

A popular class of iterative codes is Low-Density Parity-Check (LDPC) codes. An LDPC code is a linear binary block code defined by a sparse parity-check matrix H. As shown in FIG. 1, the code can be defined equivalently by a sparse bipartite graph G=(V,C,E) with a set V of N bit nodes (N=13 in FIG. 1), a set C of M check nodes (M=10 in FIG. 1) and a set E of edges (E=38 in FIG. 1) connecting bit nodes to check nodes. The bit nodes correspond to the codeword bits and the check nodes correspond to parity-check constraints on the bits. A bit node is connected by edges to the check nodes that the bit node participates with. In the matrix representation of the code on the left side of FIG. 1 an edge connecting bit node i with check node j is depicted by a non-zero matrix element at the intersection of row j and column i.

Next to the first and last check nodes of FIG. 1 are shown the equivalent rows of equation (3). The symbol "⊕" means "XOR".

LDPC codes can be decoded using iterative message passing decoding algorithms. These algorithms operate by exchanging messages between bit nodes and check nodes along the edges of the underlying bipartite graph that represents the code. The decoder is provided with initial estimates of the codeword bits (based on the communication channel output or based on the read memory content). These initial estimates are refined and improved by imposing the parity-check constraints that the bits should satisfy as a valid codeword (according to equation (3)). This is done by exchanging information between the bit nodes representing the codeword bits and the check nodes representing parity-check constraints on the codeword bits, using the messages that are passed along the graph edges.

In iterative decoding algorithms, it is common to utilize "soft" bit estimations, which convey both the bit estimations and the reliabilities of the bit estimations.

The bit estimations conveyed by the messages passed along the graph edges can be expressed in various forms. A common measure for expressing a "soft" bit estimation is as a Log-Likelihood Ratio (LLR)

$$\log \frac{Pr(v = 0 \mid \text{current constraints and observations})}{Pr(v = 1 \mid \text{current constraints and observations})},$$

where the "current constraints and observations" are the various parity-check constraints taken into account in computing the message at hand and the observations $\underline{y}$ corresponding to the bits participating in these parity checks. Without loss of generality, for simplicity we assume hereinafter that LLR messages are used throughout. The sign of the LLR provides the bit estimation (i.e., positive LLR corresponds to v=0 and negative LLR corresponds to v=1). The magnitude of the LLR provides the reliability of the estimation (i.e., |LLR|=0 means that the estimation is completely unreliable and |LLR|=±∞ means that the estimation is completely reliable and the bit value is known).

Usually, the messages passed during the decoding along the graph edges between bit nodes and check nodes are extrinsic. An extrinsic message m passed from a node n on an edge e takes into account all the values received on edges connected to n other than edge e (this is why the message is called extrinsic: it is based only on new information).

One example of a message passing decoding algorithm is the Belief-Propagation (BP) algorithm, which is considered to be the best algorithm from among this family of message passing algorithms.

Let $$P_v = \log \frac{Pr(v=0 \mid y)}{Pr(v=1 \mid y)}$$

denote the initial decoder estimation for bit v, based only on the received or read symbol y. Note that it is also possible that some of the bits are not transmitted through the communication channel or stored in the memory device, hence there is no y observation for these bits In this case, there are two possibilities: 1) shortened bits—the bits are known a-priori and $P_v = \pm \infty$ (depending on whether the bit is 0 or 1). 2) punctured bits—the bits are unknown a-priori and $$P_v = \log \frac{Pr(v=0)}{Pr(v=1)},$$

where Pr(v=0) and Pr(v=1) are the a-priori probabilities that the bit v is 0 or 1 respectively. Assuming the information bits have equal a-priori probabilities to be 0 or 1 and assuming the code is linear then $$P_v = \log \frac{1/2}{1/2} = 0.$$

Let $$Q_v = \log \frac{Pr(v=0 \mid \underline{y}, H \cdot \underline{v} = 0)}{Pr(v=1 \mid \underline{y}, H \cdot \underline{v} = 0)}$$

denote the final decoder estimation for bit v, based on the entire received or read sequence $\underline{y}$ and assuming that bit v is part of a codeword (i.e., assuming $H \cdot \underline{v} = 0$).

Let $Q_{vc}$ denote a message from bit node v to check node c. Let $R_{cv}$ denote a message from check node c to bit node v.

The BP algorithm utilizes the following update rules for computing the messages:

The bit node to check node computation rule is:

$$Q_{vc} = P_v + \sum_{c' \in N(v,G) \backslash c} R_{c'v} \quad (4)$$

Here, N(n, G) denotes the set of neighbors of a node n in the graph G and $c' \in N(v,G) \backslash c$ refers to those neighbors excluding node 'c' (the summation is over all neighbors except c).

The check node to bit node computation rule is:

$$R_{cv} = \varphi^{-1} \left( \sum_{v' \in N(c,G) \backslash v} \varphi(Q_{v'c}) \right) \quad (5)$$

Here, $$\varphi(x) = \left\{ \text{sign}(x), -\log \tanh\left(\frac{|x|}{2}\right) \right\}$$

and operations in the φ domain are done over the group $\{0,1\} \times R^+$ (this basically means that the summation here is defined as summation over the magnitudes and XOR over the signs). Analogous to the notation of equation (4), N(c,G) denotes the set of bit node neighbors of a check node c in the graph G and $v' \in N(c,G) \backslash v$ refers to those neighbors excluding node 'v' (the summation is over all neighbors except v).

The final decoder estimation for bit v is:

$$Q_v = P_v + \sum_{c' \in N(v,G)} R_{c'v} \quad (6)$$

The order of passing messages during message passing decoding is called the decoding schedule. BP decoding does not imply utilizing a specific schedule—it only defines the computation rules (equations (4), (5) and (6)). The decoding schedule does not affect the expected error correction capability of the code. However, the decoding schedule can significantly influence the convergence rate of the decoder and the complexity of the decoder.

The standard message-passing schedule for decoding LDPC code is the flooding schedule, in which in each iteration all the variable nodes, and subsequently all the check nodes, pass new messages to their neighbors (R. G. Gallager, *Low-Density Parity-Check Codes*, Cambridge, Mass.: MIT Press 1963). The standard BP algorithm based on the flooding schedule is given in FIG. 2.

The standard implementation of the BP algorithm based on the flooding schedule is expensive in terms of memory requirements. We need to store a total of 2|V|+2|E| messages (for storing the $P_v$, $Q_v$, $Q_{vc}$ and $R_{cv}$ messages). Moreover, the flooding schedule exhibits a low convergence rate and hence requires higher decoding logic (e.g., more processors on an ASIC) for providing a required error correction capability at a given decoding throughput.

More efficient, serial message passing decoding schedules, are known. In a serial message passing schedule, the bit or check nodes are serially traversed and for each node, the corresponding messages are sent into and out from the node. For example, a serial schedule can be implemented by serially traversing the check nodes in the graph in some order and for each check node $c \in C$ the following messages are sent:
1. $Q_{vc}$ for each $v \in N(c)$ (i.e., all $Q_{vc}$ messages into the node c)
2. $R_{cv}$ for each $v \in N(c)$ (i.e., all $R_{cv}$ messages from node c)

Serial schedules, in contrast to the flooding schedule, enable immediate and faster propagation of information on the graph resulting in faster convergence (approximately two times faster). Moreover, serial schedule can be efficiently implemented with a significant reduction of memory requirements. This can be achieved by using the $Q_v$ messages and the $R_{cv}$ messages in order to compute the $Q_{vc}$ messages on the fly, thus avoiding the need to use an additional memory for storing the $Q_{vc}$ messages. This is done by expressing $Q_{vc}$ as $(Q_v - R_{cv})$ based on equations (4) and (6). Furthermore, the same memory as is initialized with the a-priori messages $P_v$ is used for storing the iteratively updated $Q_v$ a-posteriori messages. An additional reduction in memory requirements is obtained because in the serial schedule we only need to use the knowledge of N(c) ∀c ∈ C, while in the standard implementation of the flooding schedule we use both data structures N(c) ∀c ∈ C and N(v) ∀v ∈ V requiring twice as much memory for storing the code's graph structure. The serially scheduled decoding algorithm appears in FIG. 3.

To summarize, serial decoding schedules have the following advantages over the flooding schedule:

1) Serial decoding schedules speed up the convergence by a factor of 2 compared to the standard flooding schedule. This means that we need only half the decoder logic in order to provide a given error correction capability at a given throughput, compared to a decoder based on the flooding schedule.
2) Serial decoding schedules provide a memory-efficient implementation of the decoder. A RAM for storing only |V|+|E| messages is needed (instead of for storing 2|V|+2|E| messages as in the standard flooding schedule). Half the ROM size for storing the code's graph structure is needed compared to the standard flooding schedule.
3) "On-the-fly" convergence testing can be implemented as part of the computations done during an iteration, allowing convergence detection during an iteration and decoding termination at any point. This can save on decoding time and energy consumption.

SUMMARY OF THE INVENTION

Iterative coding systems exhibit an undesired effect called error floor as shown in FIG. 4, where, below a certain "noise" level in the communication channel or in the memory device, the Block Error Rate (BER) at the output of the decoder starts to decrease much more slowly even tough the "noise" that is responsible for the bit errors becomes smaller. This effect is problematic, especially in storage systems, where the required decoder output block error rate should be very small ($\sim 10^{-10}$). Note that in FIG. 4 the noise increases to the right.

It is well known that the error correction capability and the error floor of an iterative coding system improve as the code length increases (this is true for any ECC system, but especially for iterative coding systems, in which the error correction capability is rather poor at short code lengths).

However, in conventional implementations of iterative coding systems, the memory complexity of the decoding hardware is proportional to the code length; hence using long codes incurs high complexity, even in the most efficient implementations known (e.g. serially scheduled decoders).

Therefore, presented herein are methods for implementing extremely long LDPC codes that provide very low error floor and near optimal error correction capability, using low complexity decoding hardware.

One embodiment provided herein is a method of decoding a representation of a codeword that encodes K information bits as N>K codeword bits, the method including: (a) updating estimates of the codeword bits by steps including: in a graph that includes N bit nodes and N-K check nodes, each bit node being connected to at least one check node by a respective edge, there being E edges in total: exchanging messages between the bit nodes and the check nodes that are so connected to each other; and (b) at any time during the exchanging of the messages, storing fewer than E of the messages.

Another embodiment provided herein is a decoder for decoding a representation of a codeword that encodes K information bits as N>K codeword bits, including: (a) a read/write memory; and (b) at least one processor for decoding the representation of the codeword by executing an algorithm for updating estimates of the codeword bits by steps including: in a graph that includes N bit nodes and N-K check nodes, each bit node being connected to at least one check node by a respective edge, there being E edges in total: exchanging messages between the bit nodes and the check nodes that are so connected to each other, while storing fewer than E of the messages in the read/write memory at any time during the exchanging of the messages.

Another embodiment provided herein is a memory controller including: (a) an encoder for encoding K information bits as a codeword of N>K codeword bits; and (b) a decoder including: (i) a read/write memory; and (ii) at least one processor for decoding the representation of the codeword by executing an algorithm for, in a graph that includes N bit nodes and N-K check nodes, each bit node being connected to at least one check node by a respective edge, there being E edges in total: exchanging messages between the bit nodes and the check nodes that are so connected to each other, while storing fewer than E of the messages in the read/write memory at any time during the exchanging of the messages.

Another embodiment provided herein is a receiver including: (a) a demodulator for demodulating a message received from a communication channel, thereby providing a representation of a codeword that encodes K information bits as N>K codeword bits; and (b) a decoder including: (i) a read/write memory; and (ii) at least one processor for decoding the representation of the codeword by executing an algorithm for, in a graph that includes N bit nodes and N-K check nodes, each bit node being connected to at least one check node by a respective edge, there being E edges in total exchanging messages between the bit nodes and the check nodes that are so connected to each other, while storing fewer than E of the messages in the read/write memory at any time during the exchanging of the messages.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a representation of the codeword, and (ii) a decoder including: (A) a read/write memory; and (B) at least one processor for decoding the representation of the codeword by executing an algorithm for, in a graph that includes N bit nodes and N-K check nodes, each bit node being connected to at least one check node by a respective edge, there being E edges in total: exchanging messages between N bit nodes and N-K check nodes of a graph that includes E edges connecting the bit nodes and the check nodes between which the messages are exchanged, while storing fewer than E of the messages in the read/write memory at any time during the exchanging of the messages.

Another embodiment provided herein is a method of decoding a representation of a codeword that encodes K information bits as N>K codeword bits, the method including: (a) updating soft estimates of the codeword bits by steps including: in a graph that includes N bit nodes and N-K check nodes, each bit node being connected to at least a portion of the check nodes: exchanging messages between the bit nodes and the check nodes that are so connected; and (b) at any time during the exchanging of the messages, storing fewer than N of the soft estimates of the codeword bits.

Another embodiment provided herein is a decoder for decoding a representation of a codeword that encodes K information bits as N>K codeword bits, including: (a) a read/ write memory; and (h) at least one processor for decoding the representation of the codeword by updating soft estimates of the codeword bits by steps including executing an algorithm for: in a graph that includes N bit nodes and N−K check nodes, each bit node being connected to at least a portion of the check nodes: exchanging messages between the bit nodes and the check nodes that are so connected, while storing fewer than N of the soft estimates of the codeword bits in the read/write memory at any time during the exchanging of the messages.

Another embodiment provided herein is a memory controller including: (a) an encoder for encoding K information bits as a codeword of N>K codeword bits; and (b) a decoder including: (i) a read/write memory; and (ii) at least one processor for decoding the representation of the codeword by updating soft estimates of the codeword bits by steps including executing an algorithm for: in a graph that includes N bit nodes and N−K check nodes, each bit node being connected to at least a portion of the check nodes: exchanging messages between the bit nodes and the check nodes that are so connected, while storing fewer than N of the soft estimates of the codeword bits in the read/write memory at any time during the exchanging of the messages.

Another embodiment provided herein is a method of decoding a representation of a codeword that encodes K information bits as N>K codeword bits, the method including: (a) updating estimates of the codeword bits by steps including: using a parity check matrix to connect a bit vector having N bit vector elements and a check vector having N−K check vector elements, the parity check matrix having E non-zero matrix elements for connecting the bit vector elements and the check vector elements: exchanging messages between the bit vector elements and the check vector elements that are so connected; and (b) at any time during the exchanging of the messages, storing fewer than E of the messages.

Another embodiment provided herein is a decoder for decoding a representation of a codeword that encodes K information bits as N>K codeword bits, including: (a) a read/write memory; and (b) at least one processor for decoding the representation of the codeword by executing an algorithm for updating estimates of the codeword bits by steps including: using a parity check matrix to connect a bit vector having N bit vector elements and a check vector having N−K check vector elements, the parity check matrix having E non-zero matrix elements for connecting the bit vector elements and the check vector elements: exchanging messages between the bit vector elements and the check vector elements that are so connected, while storing fewer than E of the messages in the read/write memory at any time during the exchanging of the messages.

Another embodiment provided herein is a memory controller including: (a) an encoder for encoding K information bits as a codeword of N>K codeword bits; and (b) a decoder including: (i) a read/write memory; and (ii) at least one processor for decoding the representation of the codeword by executing an algorithm for: using a parity check matrix to connect a bit vector having N bit vector elements and a check vector having N−K check vector elements, the parity check matrix having E non-zero matrix elements for connecting the bit vector elements and the check vector elements: exchanging messages between the bit vector elements and the check vector elements that are so connected, while storing fewer than E of the messages in the read/write memory at any time during the exchanging of the messages.

Another embodiment provided herein is a receiver including: (a) a demodulator for demodulating a message received from a communication channel, thereby providing a representation of a codeword that encodes K information bits as N>K codeword bits; and (b) a decoder including: (i) a read/write memory; and (ii) at least one processor for decoding the representation of the codeword by executing an algorithm for: using a parity check matrix to connect a bit vector having N bit vector elements and a check vector having N−K check vector elements, the parity check matrix having E non-zero matrix elements for connecting the bit vector elements and the check vector elements: exchanging messages between the bit vector elements and the check vector elements that are so connected, while storing fewer than E of the messages in the read/write memory at any time during the exchanging of the messages.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby providing a representation of the codeword, and (ii) a decoder including: (A) a read/write memory; and (3) at least one processor for decoding the representation of the codeword by executing an algorithm for: using a parity check matrix to connect a bit vector having N bit vector elements and a check vector having N−K check vector elements, the parity check matrix having E non-zero matrix elements for connecting the bit vector elements and the check vector elements: exchanging messages between the bit vector elements and the check vector elements that are so connected, while storing fewer than E of the messages in the read/write memory at any time during the exchanging of the messages.

Another embodiment provided herein is a method of decoding a representation of a codeword that encodes K information bits as N>K codeword bits, the method including: (a) updating soft estimates of the codeword bits by steps including: using a parity check matrix to connect a bit vector having N bit vector elements and a check vector having N−K check vector elements, the parity check matrix having a plurality of non-zero matrix elements for connecting the bit vector elements to the check vector elements, each bit vector element being connected thereby to at least a portion of the check vector elements: exchanging messages between the bit vector elements and the check vector elements that are so connected; and (b) at any time during the exchanging of the messages, storing fewer than N of the soft estimates of the codeword bits.

Another embodiment provided herein is a decoder for decoding a representation of a codeword that encodes K information bits as N>K codeword bits, including: (a) a read/write memory; and (b) at least one processor for decoding the representation of the codeword by updating soft estimates of the codeword bits by steps including: using a parity check matrix to connect a bit vector having N bit vector elements and a check vector having N−K check vector elements, the parity check matrix having a plurality of non-zero matrix elements for connecting the bit vector elements to the check vector elements, each bit vector element being connected is thereby to at least a portion of the check vector elements: executing an algorithm for exchanging messages between the bit vector elements and the check vector elements that are so connected, while storing fewer than N of the soft estimates of the codeword bits in the read/write memory at any time during the exchanging of the messages.

Another embodiment provided herein is a memory controller including: (a) an encoder for encoding K information bits as a codeword of N>K codeword bits; and (b) a decoder including: (i) a read/write memory; and (ii) at least one processor for decoding the representation of the codeword by updating soft estimates of the codeword bits by steps including using a parity check matrix to connect a bit vector having N bit vector elements and a check vector having N−K check vector elements, the parity check matrix having a plurality of non-zero matrix elements for connecting the bit vector elements to the check vector elements, each bit vector element being connected thereby to at least a portion of the check vector elements: executing an algorithm for exchanging messages between the bit vector elements and the check vector elements that are so connected, while storing fewer than N of the soft estimates of the codeword bits in the read/write memory at any time during the exchanging of the messages.

Four general methods are provided herein for decoding a representation of a codeword that encodes K information bits as N>K codeword bits. What is decoded is only a representation of the codeword and not the actual codeword because the codeword might have been corrupted by noise before one of the methods is applied for decoding.

According to the first general method, estimates of the codeword bits are updated using a graph that includes N bit nodes and N−K check nodes, with each bit node being connected to at least one check node by a respective edge. That the edge is "respective" to the bit node and the check node means that the edge is the unique edge of the graph that connects this bit node to this check node. The graph has a total of E edges. To update the codeword bit estimates, messages are exchanged between the bit nodes and the check nodes that are so connected. That the messages are exchanged "between" bit nodes and check nodes means that messages go only from bit nodes to check nodes and from check nodes to bit nodes, but not from bit nodes to bit nodes and not from check nodes to check nodes. At any time during the exchanging of messages the number of messages that are being stored is less than E.

Normally, the estimates of the codeword bits are soft estimates. At any time during the exchanging of the messages the number of soft estimates of the codeword bits that are being stored is less than N.

In typical embodiments of the first general method, the messages are exchanged only within each of a plurality of sub-graphs of the graph and between each sub-graph and one or more external check nodes. An "external" check node is a check node that is not part of any of the sub-graphs. Each sub-graph has a respective number of internal edges. An "internal edge" of a sub-graph is an edge that connects a bit node of the sub-graph to a check node of the sub-graph. At any time during the exchange of messages, no more messages ever are stored than the sum of the number of internal edges in the sub-graph that has the largest number of internal edges and the number of edges that connect the sub-graphs to the external check node(s). In some such embodiments, the estimates of the codeword bits are soft estimates, and no more such soft estimates ever are stored than there are bit nodes in the sub-graph that has the largest respective number of bit nodes. In some such embodiments, at any time during the exchanging of the messages, the messages are exchanged only within only one of the sub-graphs and between that sub-graph and the external check node(s), during which time, no more messages ever are stored than the sum of the number of internal edges in that sub-graph and the number of edges that connect the sub-graphs to the external check node(s). In some of these embodiments in which only one sub-graph at a time is involved in exchanging messages, the estimates of the codeword bits are soft estimates, and the number of such soft estimates stored while that sub-graph is involved in exchanging messages is at most the number of bit nodes in that sub-graph.

A decoder corresponding to the first general method includes a read/write memory (as opposed to a read-only memory, which is optional but not obligatory) and one or more processors for decoding the representation of the codeword by executing an algorithm that implements the first general method. Normally, such a decoder includes a plurality of such processors, and also includes a routing layer for routing the messages and the estimates of the codeword bits between the processors and the read/write memory in accordance with the graph. In some embodiments of such a decoder, the estimates of the codeword bits are soft estimates, and the read/write memory has sufficient storage capacity, relative to the algorithm, to store a combined total number of the messages and the soft estimates that is less than N+E. Note that such storage capacity is defined "relative to the algorithm" because the algorithm defines the precision (number of bits) with which the messages and the soft estimates are represented. For example, if the graph structure is fixed, so that N and E are fixed, then the storage capacity of the read/write memory is insufficient to store N soft estimates and E messages after the algorithm has allocated all the other space needed by the algorithm in the read/write memory, e.g. for lookup tables. As another example, if the graph structure is provided by a host of the decoder, then for at least one such graph structure, if the algorithm were a conventional serial schedule belief propagation algorithm, after the algorithm has allocated all the other space the algorithm needs in the memory, the algorithm would enter an error mode (e.g. issue a warning to the host) because there would be insufficient room in the read/write memory to store all N soft estimates and all E messages needed by such a conventional algorithm; but the algorithm actually used does not need to enter such an error mode for that graph structure because the algorithm does not need enough storage space in the read/write memory, in addition to the look-up tables etc. to store all N soft estimates and all E messages.

A memory controller corresponding to the first general method includes an encoder for encoding K information bits as a codeword of N>K codeword bits and a decoder that corresponds to the first general method.

A receiver corresponding to the first general method includes a demodulator for demodulating a message received from a communication channel. The demodulator provides a representation of a codeword that encodes K information bits as N>K codeword bits. Such a receiver also includes a decoder that corresponds to the first general method.

A communication system corresponding to the first general method includes a transmitter and a receiver. The transmitter includes an encoder for encoding K information bits of a message as a codeword of N>K codeword bits and a modulator for transmitting the codeword via a communication channel as a modulated signal. The receiver is a receiver that corresponds to the first general method.

According to the second general method, soft estimates of the codeword bits are updated by using a graph that includes N bit nodes and N−K check nodes. Each bit node is connected to some or all (usually only some) of the check nodes. The soft estimates are updated by steps including exchanging messages between the bit nodes and the check nodes that are so connected. At any time during the exchanging of the messages the number of soft estimates that are being stored is less than N.

In typical embodiments of the second general method, the messages are exchanged only within each of a plurality of sub-graphs of the graph and between each sub-graph and one or more external check nodes. No more soft estimates ever are stored than there are bit nodes in the sub-graph that has the largest respective number of bit nodes. In some such embodiments, at any time during the exchanging of the messages, the messages are exchanged only within only one of the sub-graphs and between that sub-graph and the external check node(s), during which time, no more soft estimates ever are stored than the number of bit nodes in that sub-graph.

A decoder corresponding to the second general method includes a read/write memory and one or more processors for decoding the representation of the codeword by executing an algorithm that implements the second general method. Normally, such a decoder includes a plurality of such processors, and also includes a routing layer for routing the messages and the estimates of the codeword bits between the processors and the read/write memory in accordance with the graph. In some embodiments of such a decoder, the estimates of the codeword bits are soft estimates, the number of edges in the graph that connect bit nodes and check nodes is E, and the read/write memory has sufficient storage capacity, relative to the algorithm, to store a combined total number of the messages and the soft estimates that is less than N+E.

A memory controller corresponding to the second general method includes an encoder for encoding K information bits as a codeword of N>K codeword bits and a decoder that corresponds to the second general method.

In the variants of the first and second methods that use sub-graphs, although any suitable algorithm, for example a min-sum algorithm, can be used to exchange the messages within the sub-graphs, normally the messages are exchanged according to a belief propagation algorithm. Usually, the schedule used in the belief propagation algorithm is a serial schedule.

Normally, in the variants of the first and second methods that use sub-graphs, the sub-graphs are disjoint. That the sub-graphs of the graph are "disjoint" means that no bit node is shared by any pair of sub-graphs, no check node is shared by any pair of sub-graphs, and the sub-graphs are connected by edges only via the external check node(s).

Normally, a memory controller that corresponds to the first or second general method includes circuitry for storing at least a portion of the codeword in a main memory, such as a flash memory for which the memory controller serves as a controller, and for retrieving a (possibly noisy) representation of the codeword from the main memory. Only a portion of the codeword is stored and retrieved e.g. in embodiments in which the codeword is punctured. Hence, in some embodiments of such a memory controller, the circuitry stores all of the codeword in the main memory and retrieves a representation of all of the codeword from the main memory; while in other embodiments of such a memory controller, the circuitry stores only a portion of the codeword in the main memory and retrieves a representation of the portion of the codeword from the main memory.

A memory device corresponding to the first or second general method includes such a memory controller and also includes the main memory.

As noted above, the graphical representation of LDPC decoding is equivalent to a matrix representation, as illustrated in FIG. 1. Therefore, according to the third general method, estimates of the codeword bits are updated using a parity check matrix to connect a bit vector having N bit vector elements and a check vector having N−K check vector elements. The parity check matrix has E non-zero matrix elements for connecting the bit vector elements and the check vector elements. To update the codeword bit estimates, messages are exchanged between the bit vector elements and the check vector elements that are so connected. At any time during the exchanging of messages the number of messages that are being stored is less than E.

Normally, the estimates of the codeword bits are soft estimates. At any time during the exchanging of the messages the number of soft estimates of the codeword bits that are being stored is less than N.

In typical embodiments of the third general method, the messages are exchanged only according to each of a plurality of sub-matrices of the parity check matrix and between each sub-matrix and one or more external check vector elements. An "external" check vector element is a check vector element that is not connected to any bit vector element by a non-zero matrix element of any of the sub-matrices, but is only connected to one or more bit vector elements by one or more non-zero matrix elements that are not in any of the sub-matrices. Exchanging messages "between" a sub-matrix and an external check vector element means exchanging messages between the external check vector element and one or more of the bit vector elements that are connected to other check vector elements by the non-zero matrix elements of the sub-matrix. Each sub-matrix has a respective number of its own "internal" non-zero matrix elements. At any time during the exchange of messages, no more messages ever are stored than the sum of the number of internal non-zero matrix elements in the sub-matrix that has the largest number of internal non-zero matrix elements and the number of non-zero matrix elements that connect the sub-matrices to the external check vector element(s). An external check vector element is "connected to" a sub-matrix if that external check vector element is connected by a non-zero matrix element of the parity check matrix to one or more bit vector elements that are connected to other check vector elements by the non-zero matrix elements of the sub-matrix. In some such embodiments, the estimates of the codeword bits are soft estimates, and no more such soft estimates ever are stored than there are bit vector elements associated with the sub-matrix that has the largest respective number of bit vector elements associated therewith. The bit vector elements that are "associated with" a sub-matrix are the bit vector elements that are connected to check vector elements by the sub-matrix. According to the convention shown in FIG. 1, in which each column of the parity check matrix corresponds to one bit vector element, the number of bit vector elements that are associated with a sub-matrix is the number of columns in the sub-matrix.

A decoder corresponding to the third general method includes a read/write memory and one or more processors for decoding the representation of the codeword by executing an algorithm that implements the third general method. Normally, such a decoder includes a plurality of such processors, and also includes a routing layer for routing the messages and the estimates of the codeword bits between the processors and the read/write memory in accordance with the parity check matrix. In some embodiments of such a decoder, the estimates of the codeword bits are soft estimates, and the read/write memory has sufficient storage capacity, relative to the algorithm, to store a combined total number of the messages and the soft estimates that is less than N+E.

A memory controller corresponding to the third general method includes an encoder for encoding K information bits as a codeword of N>K codeword bits and a decoder that corresponds to the third general method.

A receiver corresponding to the third general method includes a demodulator for demodulating a message received from a communication channel. The demodulator provides a representation of a codeword that encodes K information bits as N>K codeword bits. Such a receiver also includes a decoder that corresponds to the third general method.

A communication system corresponding to the third general method includes a transmitter and a receiver. The transmitter includes an encoder for encoding K information bits of a message as a codeword of N>K codeword bits and a modulator for transmitting the codeword via a communication channel as a modulated signal. The receiver is a receiver that corresponds to the third general method.

The fourth general method also is based on the matrix representation of FIG. 1. According to the fourth general method, soft estimates of the codeword bits are updated using a parity check matrix to connect a bit vector having N bit vector elements and a check vector having N-K check vector elements. The parity check matrix has a plurality of non-zero matrix elements for connecting the bit vector elements to the check vector elements. Each bit vector element is connected to some or all (usually only some) of the check vector elements. The soft estimates are updated by steps including exchanging messages between the bit vector elements and the check vector elements that are so connected. At any time during the exchanging of the messages the number of soft estimates that are being stored is less than N.

In typical embodiments of the fourth general method, the messages are exchanged only according to each of a plurality of sub-matrices of the parity check matrix and between each sub-matrix and one or more external check vector elements. No more soft estimates ever are stored than there are bit vector elements associated with the sub-matrix that has the largest respective number of bit vector elements associated therewith.

A decoder corresponding to the fourth general method includes a read/write memory and one or more processors for decoding the representation of the codeword by executing an algorithm that implements the fourth general method. Normally, such a decoder includes a plurality of such processors, and also includes a routing layer for routing the messages and the estimates of the codeword bits between the processors and the read/write memory in accordance with the parity check matrix. In some embodiments of such a decoder, the estimates of the codeword bits are soft estimates, the number of non-zero matrix elements in the parity check matrix that connect the bit vector elements and the check vector elements is E, and the read/write memory has sufficient storage capacity, relative to the algorithm, to store a combined total number of the messages and the soft estimates that is less than N+E.

A memory controller corresponding to the fourth general method includes an encoder for encoding K information bits as a codeword of N>K codeword bits and a decoder that corresponds to the fourth general method.

Normally, a memory controller that corresponds to the third or fourth general method includes circuitry for storing at least a portion of the codeword in a main memory, such as a flash memory for which the memory controller serves as a controller, and for retrieving a (possibly noisy) representation of the codeword from the main memory.

A memory device corresponding to the third or fourth general method includes such a memory controller and also includes the main memory.

In all four general methods, although any suitable algorithm, for example a min-sum algorithm, can be used to exchange the messages, normally the messages are exchanged according to a belief propagation algorithm. Usually, the schedule used in the belief propagation algorithm is a serial schedule.

BRIEF DESCRIPTION OF THE DRAWINGS

Various embodiments are herein described, by way of example only, with reference to the accompanying drawings, wherein:

FIG. 2 shows a flooding schedule belief propagation algorithm according to the prior art;

FIG. 3 shows a conventional serial schedule belief propagation algorithm according to the prior art;

FIG. 6 shows a belief propagation algorithm in which messages are exchanged within sub-graphs and between the sub-graphs and a set of external check nodes;

DESCRIPTION OF THE PREFERRED EMBODIMENTS

Figure 1:
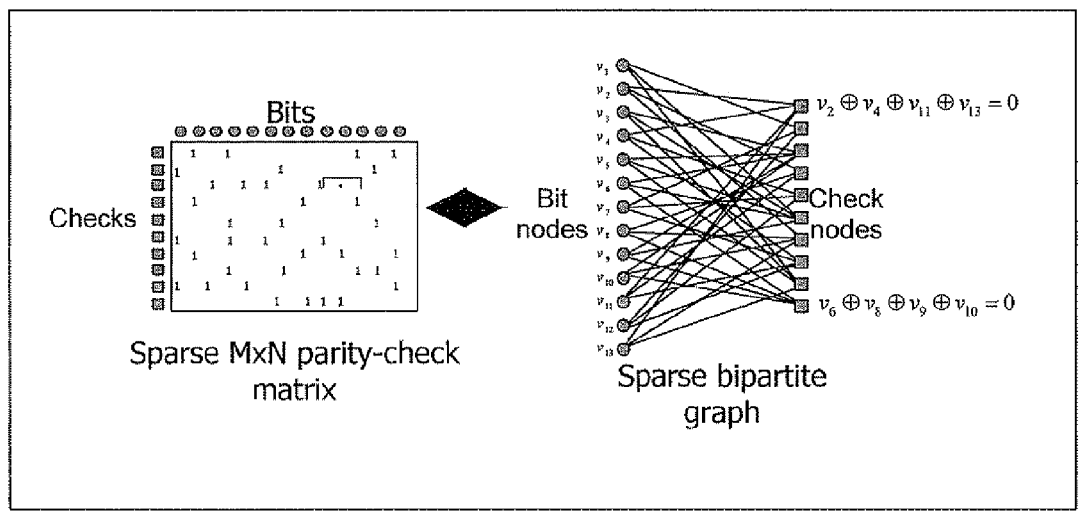
FIG. 1 shows how a LDPC code can be represented as either a sparse parity check matrix or a sparse bipartite graph according to the prior art.
Figure 4:
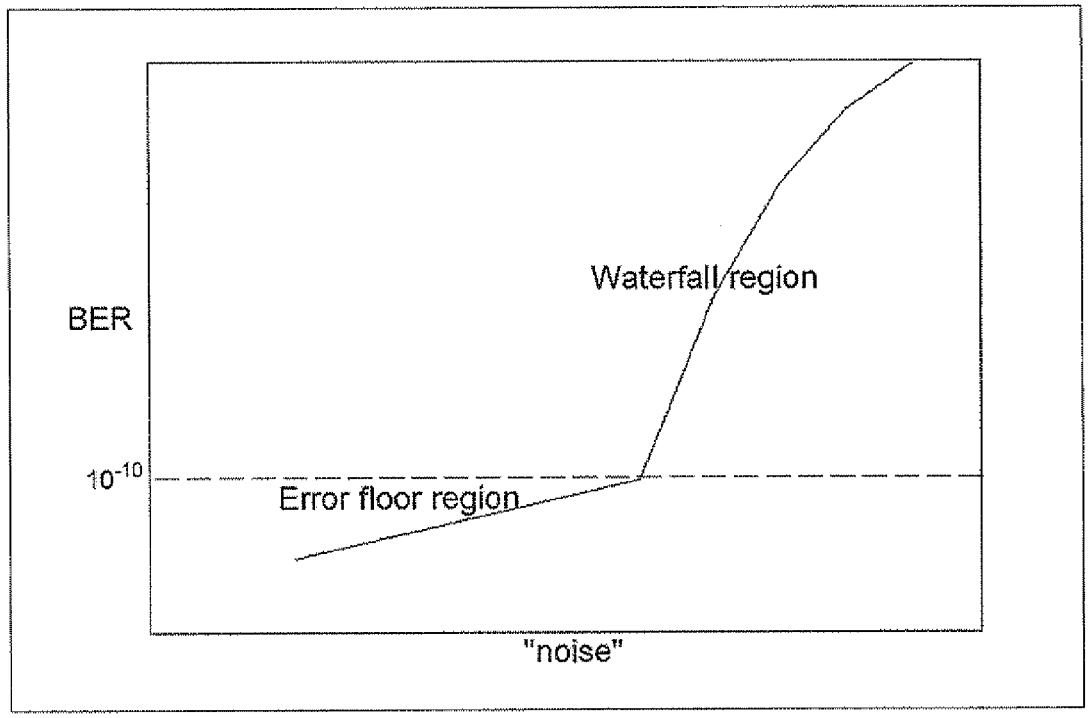
FIG. 4 illustrates error floor according to the prior art.

The principles and operation of low-complexity LPDC decoding may be better understood with reference to the drawings and the accompanying description.

In conventional decoders for LDPC codes, the memory required by the decoder is proportional to the code length N (equal to the number of variable nodes in the coders underlying graph $|V|$) and to the number of edges in the code's underlying graph $|E|$. In efficient implementations (e.g. based on serially scheduled decoders), the required memory can be as small as $(|V|+|E|)*bpm$ bits, where $|V|$ is the number of bit estimations, $|E|$ is the number of edge messages and bpm is the number of bits per message stored in the memory of the decoder (note that we assume here that the same number of bits is required for storing bit estimation and edge message, for the sake of simplicity, though this is not necessarily the case). The decoder presented herein uses much smaller memory for implementing the decoding, storing only a small fraction of the $|V|$ bit estimations and of the $|E|$ edge messages simultaneously, without any degradation in decoder's error correction capability, compared to a conventional decoder, assuming sufficient decoding time is available. This is achieved by employing an appropriate decoding schedule and using the decoding hardware described herein.

The methods and decoders described herein operate by dividing the underlying graph representing the code into several sections and to implement the message passing decoding algorithm by sequentially processing the different sections of the graph, one or more sections at a time. At each stage during decoding only the bit estimations and edge messages corresponding to the graph section(s) that is/are currently being processed are stored. This way a very long LDPC code can be employed, providing near optimal error correction capability and very low error floor, while utilizing a low complexity decoding hardware.

The decoders presented herein are highly suitable for usage in memory devices, principally for the three following reasons:

1. A low ECC error floor is especially important in memory devices, which have severe decoder output BER requirements ($<10^{-15}$). When short codes are used, achieving such low error floor is very hard and usually requires sacrificing the error correction capability of the code, which is already compromised due to the short length of the code. Therefore using an equivalent long code the error correction capability of the code is improved, and thus lower ECC redundancy is required for protecting information against a given memory "noise" which corrupts the stored data. This in turn results in better cost efficiency of the memory, because a larger amount of information can be stored in a given number of memory cells (or using a given memory silicon size). Hence, employing a long ECC in memory devices is expected to provide a significant advantage.

2. The LDPC methods presented herein allow for processing a section of the code's underlying graph at each processing phase, instead of the entire graph at once. This means that we can store only a part of the "soft" bit estimations at each phase and not all of the "soft" bit estimations at once. Here the term "soft" bit estimates refers to a collection of bits describing the reliability of an estimate 'y' for each stored bit deduced from reading from the storage (possibly flash device).

This feature can be easily utilized in a memory device, because only the presently required bit observations (y) can be read from the storage device, hence there is no need for a large buffer in the memory controller in order to implement the ECC decoding. Alternatively, even if all bit observations (represented by the vector y) are read from the memory at once, the buffer required for storing them is usually much smaller than the memory required for storing the bit observations (the $P_v$ messages) required by the decoder. This way, only part of the soft bit estimates corresponding to the graph section that is currently being processed by the decoder are generated each time, resulting in a smaller decoder memory requirement.

Consider for example a SLC Flash memory device (a Flash memory device that stores one bit per cell; "SLC" means "Single Level Cell" and actually is a misnomer because each cell supports two levels; the "S" in "SLC" refers to there being only one programmed level.), in which each cell stores a single bit v and the state y read from each cell can be either 0 or 1. Then the memory needed for storing the vector y of read cell states is N bits. On the other hand, the memory required for storing all the soft bit estimates ($P_v$ messages) can be larger (for example 6N bits if each LLR estimate is stored in 6 bits). Hence, it is more efficient to generate only the required soft bit estimates in each decoder activation. A LLR bit estimate $$P_v = \log \frac{Pr(v=0|y)}{Pr(v=1|y)}$$

for some bit v can be generated from the corresponding bit observations y that are read from the flash memory device based on an a-priori knowledge of the memory "noise". In other words, by knowing the memory "noise" statistics we can deduce the probability that a bit v that was stored in a certain memory cell is 0/1 given that 'y' is read from the cell.

For example, assume that in a certain SLC Flash memory device the probability of reading the state of the cell different than the one it was programmed to is $p=10^{-2}$, then if y=0 then $$P_v = \log \frac{1-p}{p} = 4.6$$

and if y=1 then $$P_v = \log \frac{p}{1-p} = -4.6.$$

Furthermore, if the number of states that can be read from each cell of the flash device (represented by 'y') is 8 because the cell stores a single bit (one "hard bit") and the device is configured to read eight threshold voltage levels, equivalent to two "soft bits", then each element 'y' which requires, in the controller, storage for 3 bits, is converted to an LLR value $P_v$ that may be represented as more than 3 bits, for example as 6 bits (BPM=Bits Per Message=6). These 6 bits are a soft bit estimate as opposed to the 2 soft bits read from the flash cell and corresponding to this 6-bit LLR value.

3. A decoding schedule of the type presented herein allow for a smaller memory requirement (compared with conventional decoding schedules). However, the decoding schedules presented herein might slow down the decoder convergence rate and increase the decoding time, especially when operating near the decoder's maximal error correction capability. Such a decoder is highly suitable for memory devices, which can tolerate variable ECC decoding latencies. For example, if the required decoding time for the ECC to converge to the correct stored codeword is long due to a high number of corrupted bits, then the memory controller can stop reading the memory until the decoding of the previously read codeword is finalized. Note that during most of a flash memory device's life, the memory "noise" is small and the number of corrupted bits is small. Hence, the decoder operates efficiently and quickly, allowing for an efficient pipelined memory reading. Rarely, the number of corrupted bits read from the memory is high, requiring longer decoding time and resulting in a reading pipeline stall. Therefore on average the throughput is left unharmed even with these variable decoding time characteristics.

According to one class of embodiments, the bipartite graph G=(V,C,E) that represents the code is divided into several sections in the following way. 1) Divide the set V of bit nodes into t disjoint subsets: $V_1, V_2, \ldots, V_t$ (such that $V=V_1 \cup V_2 \cup \ldots \cup V_t$). 2) For each subset $V_i$ of bit nodes, form a subset $C_i$ of check nodes, including all of the check nodes that are connected solely to the bit nodes in $V_i$. 3) Form a subset $C_J$ of external check nodes, including all of the check nodes that are not in any of the check node subsets formed so far, i.e. $C_J = C \setminus (C_1 \cup C_2 \cup \ldots \cup C_t)$. 4) Divide the graph G into t sub-graphs $G_1, G_2, \ldots, G_t$ such that $G_i=(V_i, C_i, E_i)$ where $E_i$ is the set of edges connected between bit nodes in $V_i$ and check nodes in $C_i$. Denote the edges connected to the set $C_J$ by $E_J$ (note that $E_J = E \setminus (E_1 \cup E_2 \cup \ldots \cup E_t)$).

Figure 5:
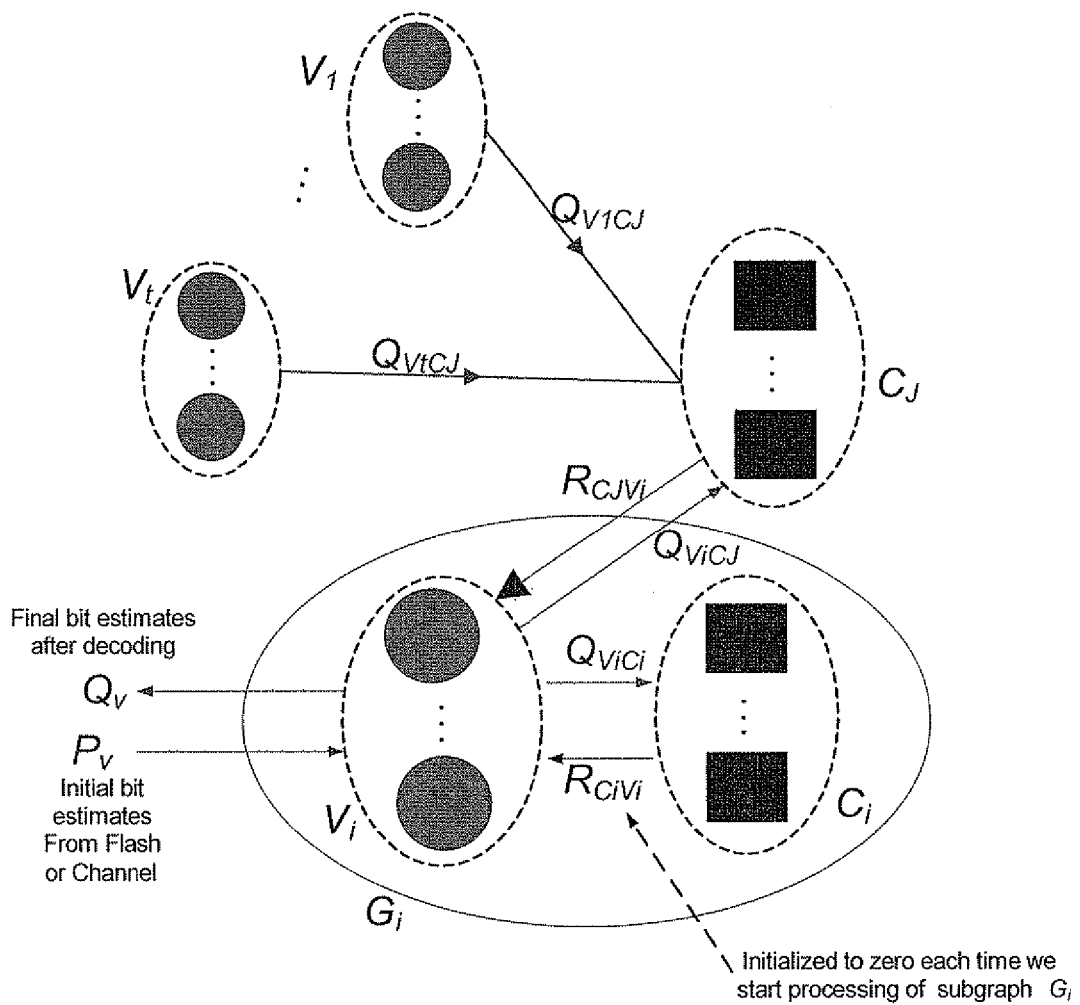
FIG. 5 shows how messages are exchanged within a sub-graph and between a sub-graph and a set of external check nodes.

In these embodiments, the graph G is processed according to a special message passing schedule, by iteratively performing decoding phases, and in each decoding phase exchanging messages along the graph edges in the following order:

for i=1 through t
1. Send $R_{cv}$ messages from check nodes $c \in C_J$ to bit nodes $v \in V_i$ along edges in $E_J$, depicted as the $R_{C_JV_i}$ messages in FIG. 5. Set $R_{cv}$ messages from check nodes $c \in C_i$ to bits nodes $v \in V_i$ to zero, depicted by the $Rc_iv_i$ messages in FIG. 5. Set initial bit estimations to $P_v$ for every bit $v \in V_i$, depicted as the $P_{Vi}$ messages in FIG. 5. Note that the messages $R_{C_JV_i}$ are the result of activating the decoder for the other t−1 sub-graphs $G_k$, k≠i, prior to this step. In the event that other sub-graphs have not been processed yet, their corresponding messages $Q_{ViCJ}$ in FIG. 5 are set to $P_{Vi}$, i.e., the estimates read from the memory or received from the communication channel. In case those are punctured bits, their $P_{Vi}$'s are zero.
2. Perform one or more iterations by sending $Q_{vc}$ messages from bit nodes in $V_i$ to check nodes in $C_i$, and $R_{cv}$ messages from check nodes in $C_i$ to bit nodes in $V_i$, along the edges in $E_i$, according to some schedule (e.g. according to the serial schedule described in FIG. 3, performed by serially traversing the check nodes in $C_i$ and for each check node sending the messages to and from that check node). This is depicted as the $Qv_ic_i$ and $Rc_iv_i$ messages in FIG. 5.
3. Send $Q_{vc}$ messages from bit nodes in $V_i$ to check nodes in $C_J$ along the edges in $E_J$, depicted as the $Qv_ic_J$ messages in FIG. 5.

Decoding continues until the decoder converges to a valid codeword, satisfying all the parity-check constraints, or until a maximum number of allowed decoding phases is reached. The stopping criterion for the message passing within each sub-graph i is similar: iterate until either all the parity-check constraints within this sub-graph are satisfied or a maximum number of allowed iterations is reached. In general, the maximum allowed number of iterations may change from one sub-graph to another or from one activation of the decoder to another.

The messages sent along the edges in $E_J$ ($R_{C_JV_i}$ messages and $Qv_ic_J$ messages in FIG. 5) are used for exchanging information between the different sections of the graph. The messages that are sent at each stage during decoding can be computed according to the standard computation rules of the message passing decoding algorithm. For example, if BP decoding is implemented then the messages are computed according to equations (4) and (5). Other message-passing decoding algorithms, such as Min Sum algorithms, Gallagher A algorithms and Gallagher B algorithms, have their own computation rules.

Such a decoding algorithm, assuming serially scheduled message passing decoding within each sub-graph, implementing BP decoding, is summarized in FIG. 6. In this algorithm, at each stage during decoding only the $Q_v$ messages corresponding to bit nodes $v \in V_i$, the $R_{cv}$ messages corresponding to the edges in $E_i$ and the messages corresponding to the edges in $E_J$ are stored. Hence, the decoder of this class of embodiments requires storing only (max $\{|V_1|,|V_2|, \ldots, |V_t|\}$+max $\{|E_1|,|E_2|, \ldots, |E_t|\}$+$|E_J|$) messages simultaneously, compared to ($|V|+|E|$) messages in efficient conventional decoders. Thus the memory requirement is ~1/t fraction of the memory required for a conventional decoder. When implementing long LDPC codes this provides a significant advantage in a decoder's complexity.

Figure 7A:
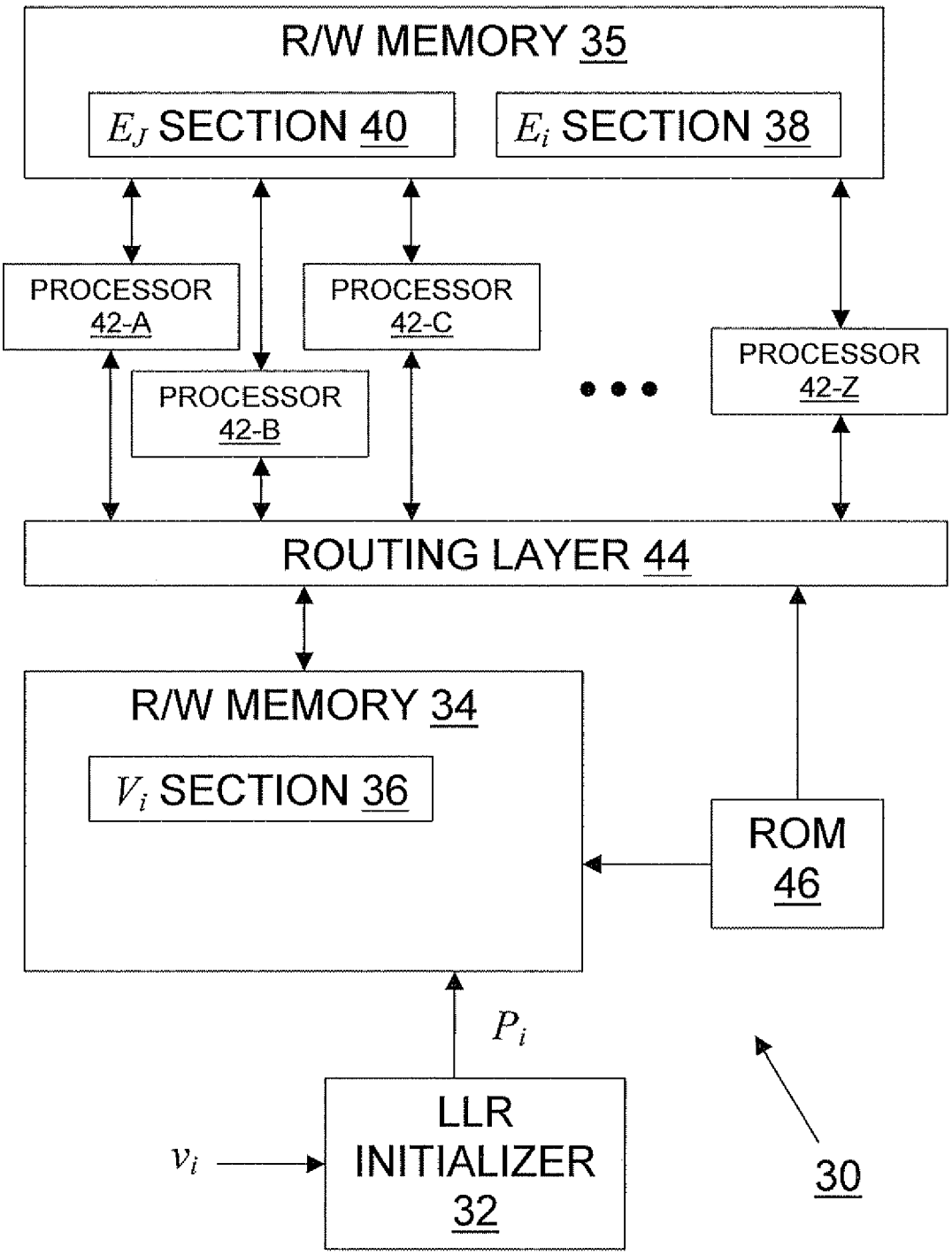
FIGS. 7A and 7B are high-level schematic block diagrams of decoders for implementing the algorithm of FIG. 6.

A high-level schematic block diagram of an exemplary decoder 30 according to this class of embodiments is shown in FIG. 7A. Decoder 30 includes:

1. An initial LLRs computation block 32 that computes the initial bit estimations $P_i=[P_v:v \in V_i]$ for bits $v \in V_i$ in the currently processed sub-graph $G_i=(V_i,C_i,E_i)$, based on the corresponding bit observations $y_i=[y_v:v \in V_i]$ read from the memory or received from the communication channel (where $y_v$ is the observation corresponding to bit v).
2. A read/write memory 34 including a memory section 36 for storing the bit estimations for bit nodes $v \in V_i$ in the currently processed sub-graph ($Q_v$ messages which are initialized as the $P_v$ messages).
3. A read/write memory 35 including:
   3a. A memory section 38 for storing the $R_{cv}$ messages corresponding to the edge set $E_i$ of the currently processed sub-graph.
   3b. A memory section 40 for storing the messages along the edges in $E_J$. Memory section 40 stores: i) the $Q_{vc}$ messages from bit nodes $v \in V_{i'}$, $\forall i' \in \{1, \ldots, n\}\setminus i$ to check nodes $c \in C_J$, where i is the index of the currently processed sub-graph ii) for bit nodes $v \in V_i$ memory section 40 first stores the $R_{cv}$ messages from check nodes $c \in C_J$ and afterwards the sub-graph's processing memory section 40 stores the $Q_{vc}$ to check nodes $c \in C_J$.
4. Processing units 42 for implementing the computations involved in updating the messages (as shown in FIG. 6).
5. A routing layer 44 that routes messages between memory 34 and processing units 42. For example, in some sub-classes of this class of embodiments, within the loop over sub-graphs $G_1$ through $G_t$ in FIG. 6, routing layer 44 assigns each processor 42 its own check node of the current sub-graph $G_i$ and the check node processing is done in parallel for all the check nodes of $G_i$ (or for as many check nodes of $G_i$ as there are processors 42).
6. A read-only memory (ROM) 46 for storing the code's graph structure. Memory addressing, and switching by routing layer 44, are based on entries in ROM 46.

Decoder 30 includes a plurality of processing units 42 so that the computations involved in updating the messages may be effected in parallel. An alternative embodiment with only one processing unit 42 would not include a routing layer 44.

Figure 7B:
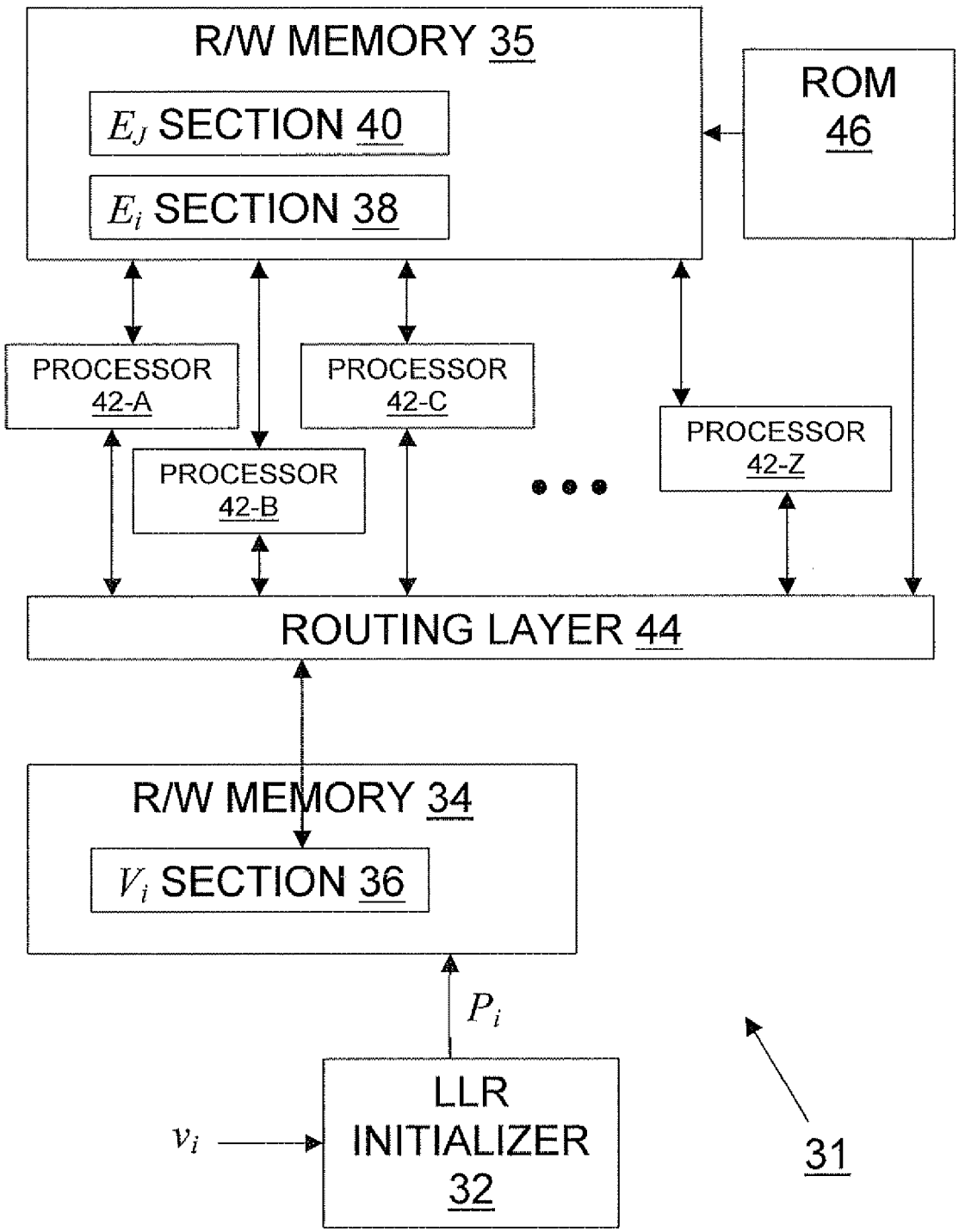

As noted above, a serial passing schedule traverses serially either the check nodes or the bit nodes. Decoder 30 of FIG. 7A traverses the check nodes serially. FIG. 7B is a high-level schematic block diagram of a similar decoder 31 that traverses the bit nodes serially.

Figure 8:
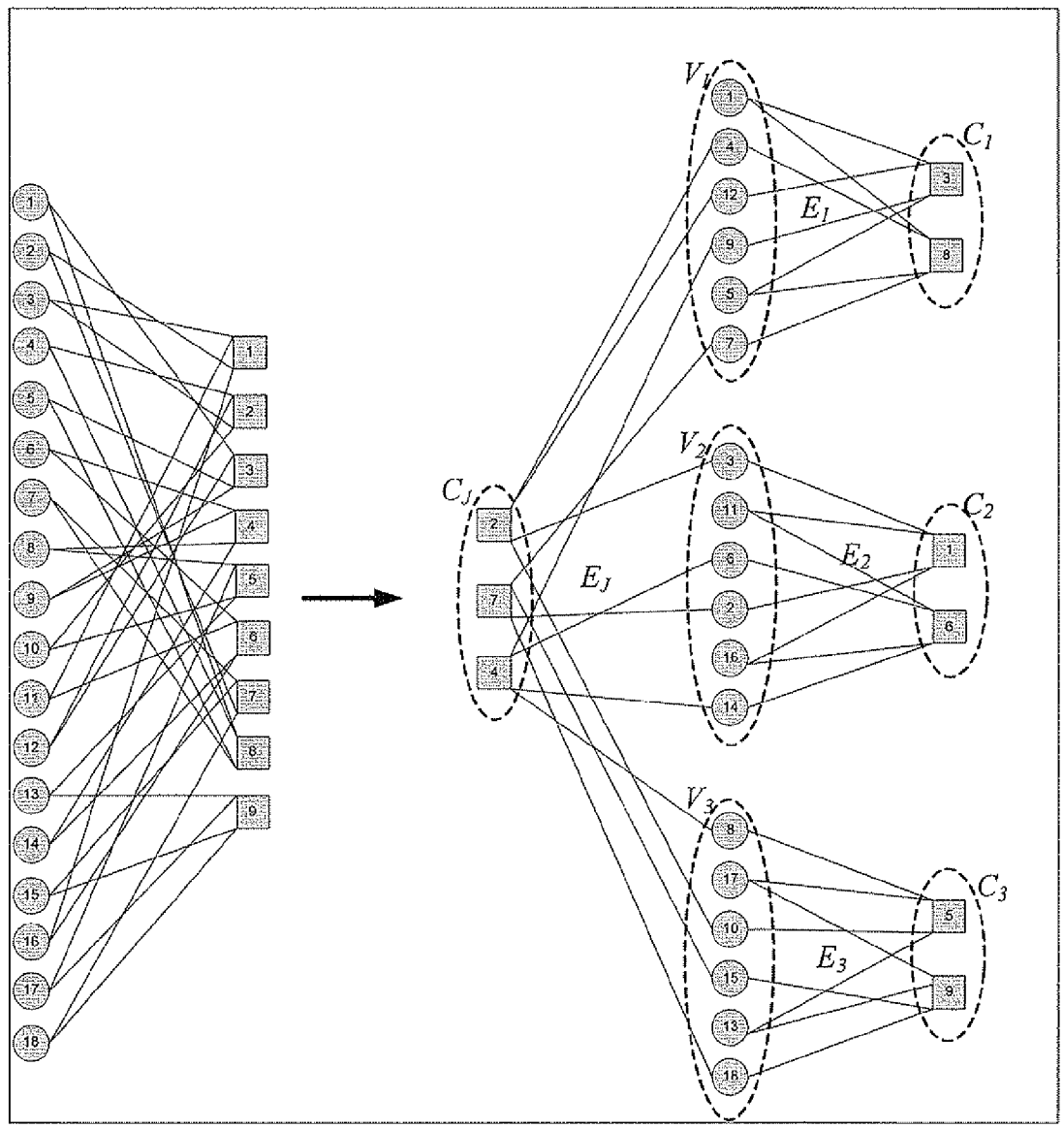
FIGS. 8 and 9 show two ways of partitioning the sparse bipartite graph of FIG. 1 into sub-graphs.

An example of the graph partitioning according to this class of embodiments is shown in FIG. 8. An LDPC code which is described by a regular bipartite graph with 18 bit nodes and 9 check nodes, such that every bit node is connected to two check nodes and every check node is connected to four bit nodes is used in this example. This is a length 18, rate 1/2 LDPC code. The original graph is shown on the left side of FIG. 8. This also is the graph of FIG. 1. The graph after partitioning its bit nodes, check nodes and edges into subsets is shown on the right side of FIG. 8. Note that this is the same graph, only rearranged for sake of clarity. For this code, a prior art efficient decoder would require storing 18+36=54 messages, while the corresponding decoder 30 requires storing only 6+8+12=26 messages, providing 52% reduction in the decoder's memory complexity, while maintaining the same error correction capability.

It is preferred that all the sub-graphs be topologically identical, as in the example of FIG. 8. In this context, "topological identity" means that all the sub-graphs have equal numbers of bit nodes and equal numbers of check nodes; that each bit node has a corresponding bit node in every other sub-graph in terms of connectivity to internal check nodes; and that each sub-graph check node has a corresponding check node in every other sub-graph in terms of connectivity to bit nodes. For example, in FIG. 8:

Bit nodes 1, 5, 11, 13, 16 and 17 correspond because bit nodes 1 and 5 are connected to both check nodes of sub-graph 1, bit nodes 11 and 16 are connected to both check nodes of sub-graph 2, bit nodes 13 and 17 are connected to both check nodes of sub-graph 3, and none of these bit nodes is connected to an external check node (a check node of set $C_J$).

The remaining bit nodes correspond because each of these bit nodes is connected to one check node of the same sub-graph.

All the check nodes of the sub-graphs correspond because each one of these check nodes is connected to the two bit nodes of its sub-graph that are connected only to sub-graph check nodes and to two other bits of its sub-graph that are also connected to external check nodes.

Note that the sub-graphs need not have identical connectivity to the external check nodes in order to be "topologically identical". For example, the two bit nodes, 15 and 18, of sub-graph 3, that are connected to the same external check node 7, are also connected to the same check node 9 of sub-graph 3, but the two bit nodes, 4 and 12, of sub-graph 1, that are connected to the same external check node 2, are connected to different check nodes (3 and 8) of sub-graph 1.

If need be, however, any LDPC graph G can be partitioned into sub-graphs by a greedy algorithm. The first sub-graph is constructed by selecting an arbitrary set of bit nodes. The check nodes of the first sub-graph are the check nodes that connect only to those bit nodes. The second sub-graph is constructed by selecting an arbitrary set of bit nodes from among the remaining bit nodes. Preferably, of course, the number of bit nodes in the second sub-graph is the same as the number of bit nodes in the first sub-graph. Again, the check nodes of the second sub-graph are the check nodes that connect only to the bit nods of the second sub-graph. This is arbitrary selection of bit nodes is repeated as many times as desired. The last sub-graph then consists of the bit nodes that were not selected and the check nodes that connect only to those bit nodes. The remaining check nodes constitute $C_J$.

Figure 9:
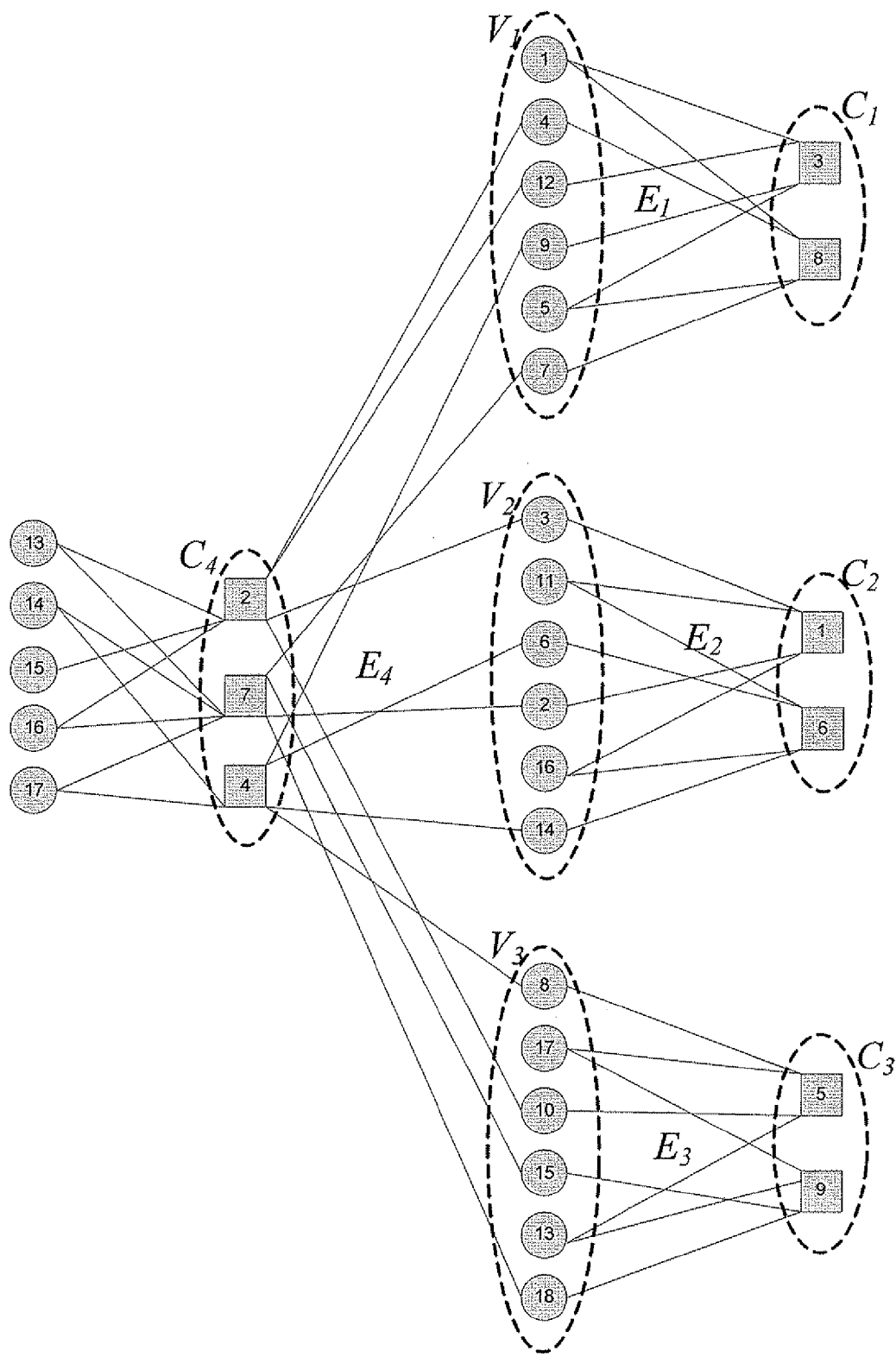

In the class of embodiments described above, the LDPC graph G is partitioned into t sub-graphs, each with its own bit nodes and check nodes, plus a separate subset $C_J$ of only check nodes. In another class of embodiments, as illustrated in FIG. 9, G is partitioned into just t sub-graphs, each with its own bit nodes and check nodes. For example, using the greedy algorithm described above, the last sub-graph ($G_t$) includes the non-selected bit nodes, the check nodes that connect only to these bit nodes, and also all the remaining check nodes. This is equivalent to the set $C_J$ of the first class of embodiments being connected to its own subset of bit nodes separate from the bit nodes of the sub-graphs. In this class of embodiments, the algorithm of FIG. 6 is modified by including only sub-graphs $G_1$ through $G_{t-1}$ in the sub-graphs loop and ending each decoding phase by following the sub-graphs loop with a separate exchange of messages exclusively within $G_t$. FIG. 9 shows the case of t=4. In one subclass of these embodiments, some of the bits are punctured bits, and $G_t$ is dedicated to these bits: all the bits of $G_t$ are punctured bits, and all the punctured bits are bits of $G_t$.

Figure 10:
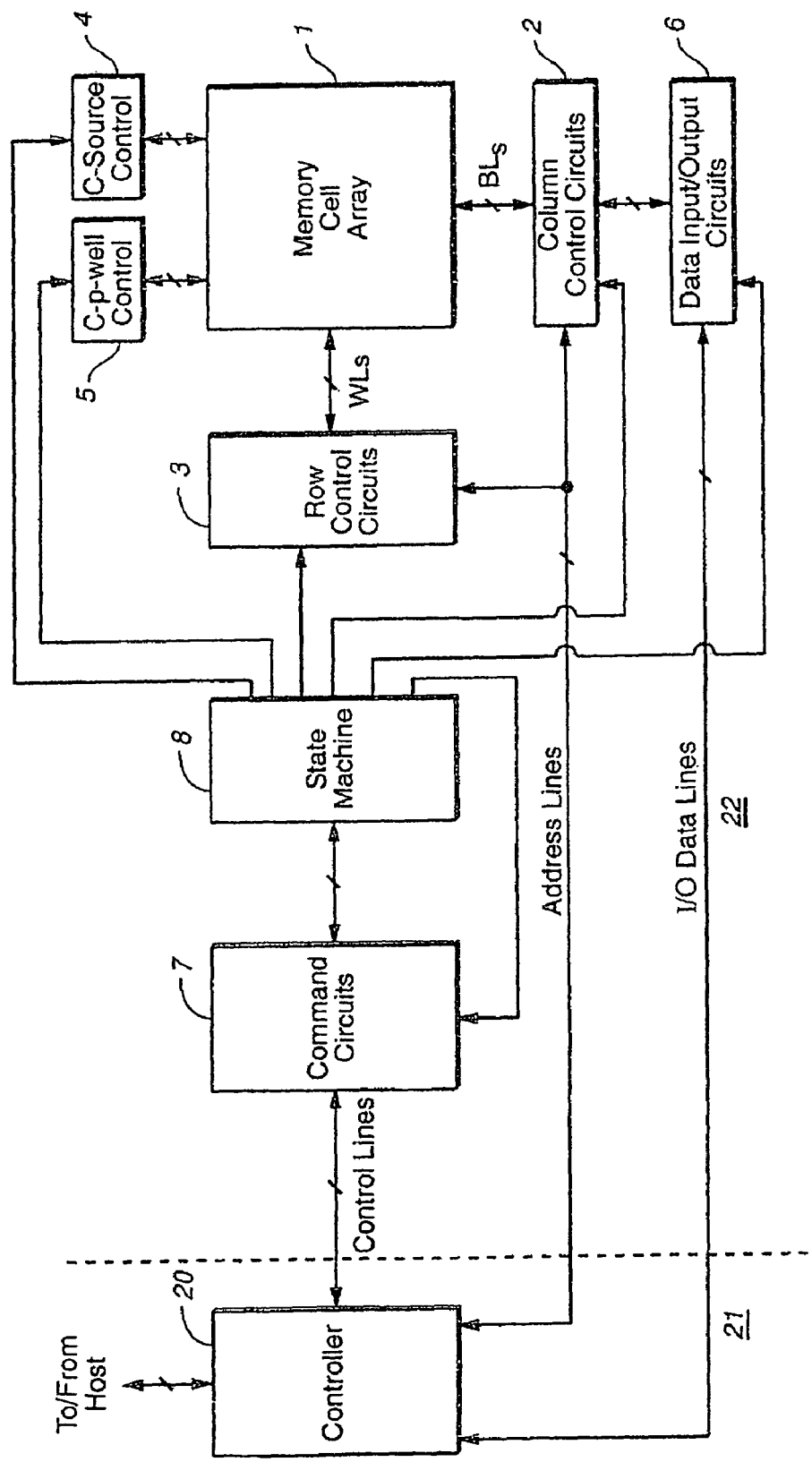
FIG. 10 is a high-level schematic block diagram of a flash memory device whose controller includes the decoder of FIG. 7A.

FIG. 10 is a high-level schematic block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contain a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 11:
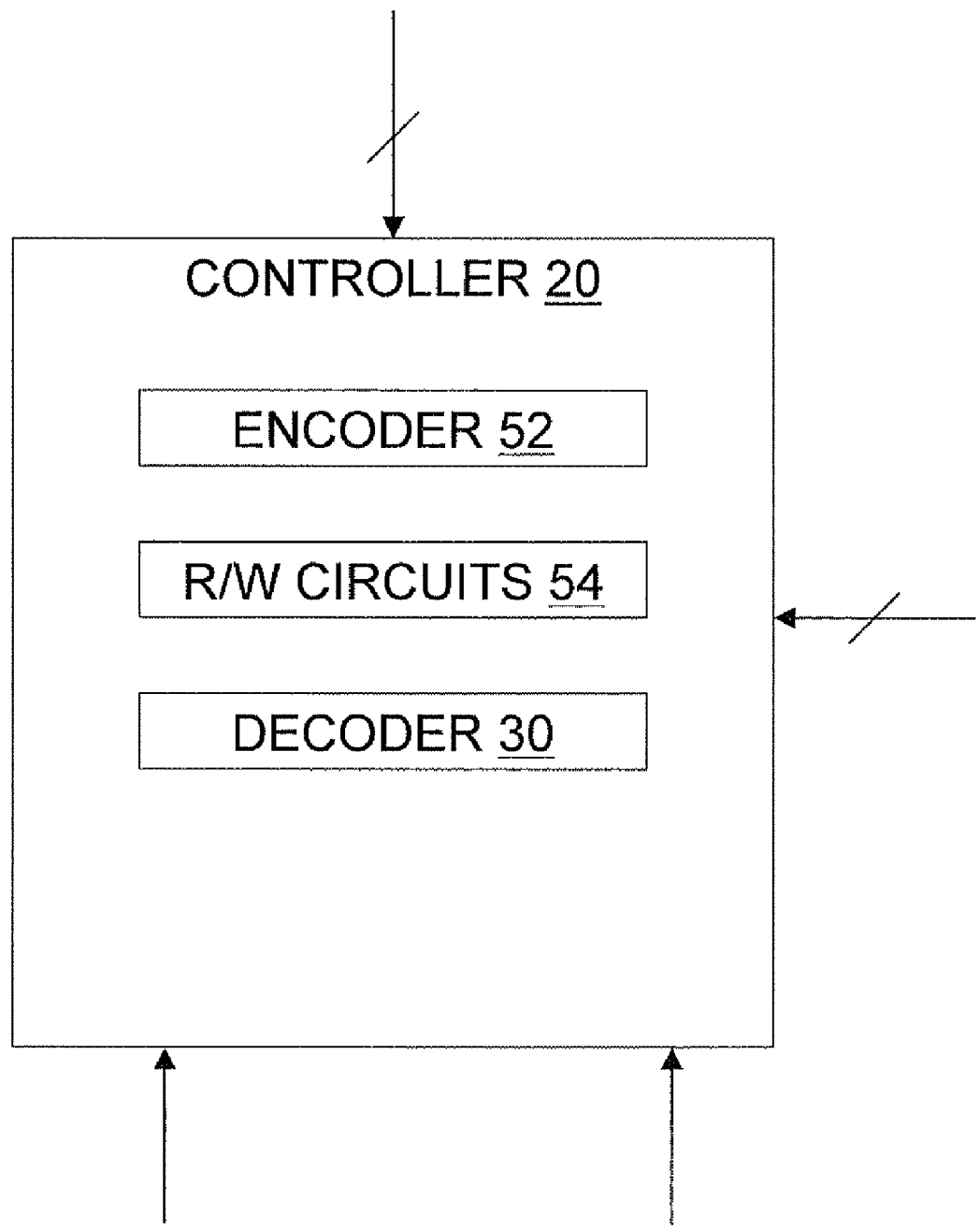
FIG. 11 is a detail of FIG. 10.

FIG. 11 is an enlarged view of part of FIG. 10, showing that controller 20 includes an encoder 52 for encoding user data received from the host as one or more codewords, circuitry 54 for instructing command circuits 7 to store the codewords (or only the non-punctured bits thereof if any of the bits of the codewords are punctured bits) in memory cell array I and for instructing command circuits 7 to retrieving the stored codewords (or the stored portions thereof in the punctured bit case) from memory cell array 1, and decoder 30 for decoding the representation of the codewords as retrieved by circuitry 54. Alternatively, controller 20 could include decoder 31 instead of decoder 30.

Although the methods and the decoders disclosed herein are intended primarily for use in data storage systems, these methods and decoders also are applicable to communications systems, particularly communications systems that rely on wave propagation through media that strongly attenuate high frequencies. Such communication is inherently slow and noisy. One example of such communication is radio wave communication between shore stations and submerged submarines.

Figure 12:
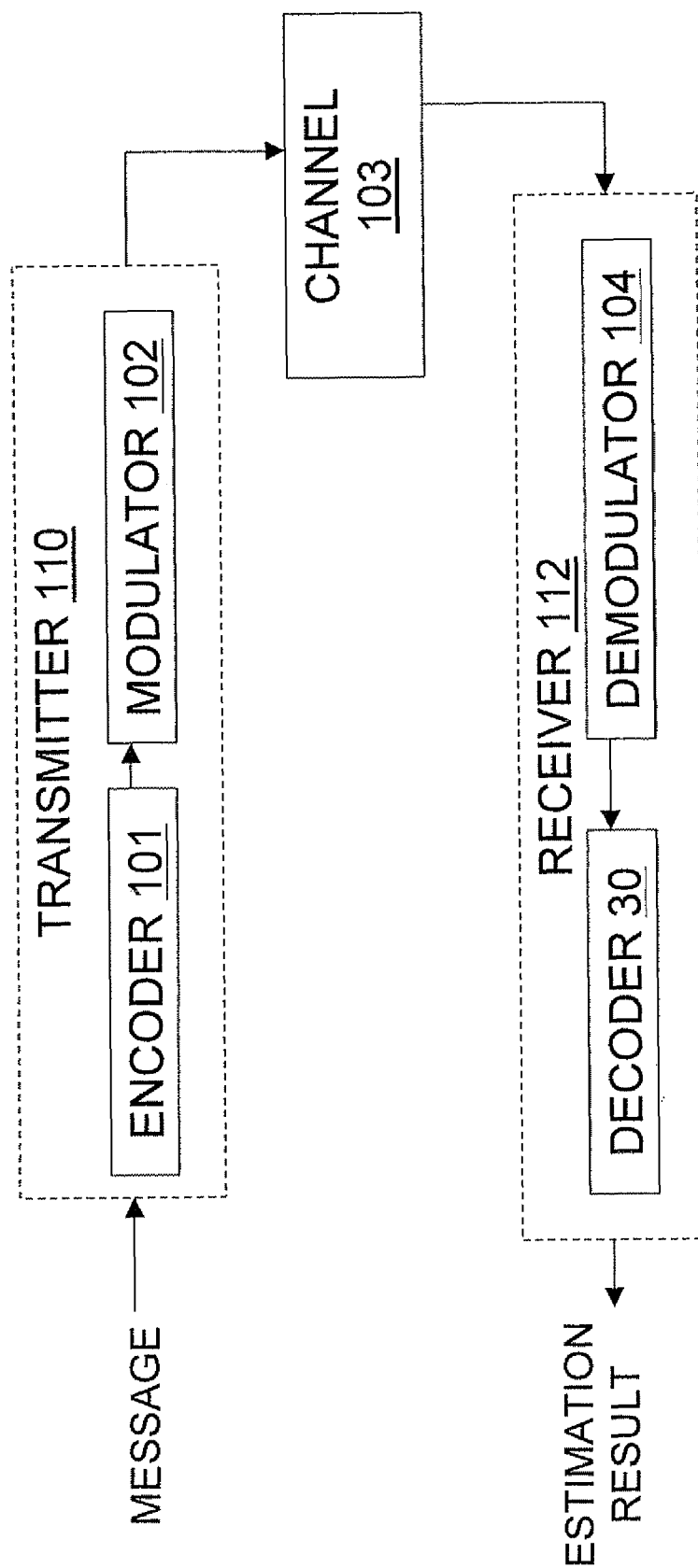
FIG. 12 is a high-level schematic block diagram of a communication system whose receiver includes the decoder of FIG. 7A.

FIG. 12 is a high-level schematic block diagram of a communication system 100 that includes a transmitter 110, a channel 103 and a receiver 112. Transmitter 110 includes an encoder 101 and a modulator 102. Receiver 112 includes a demodulator 104 and decoder 30. Encoder 101 receives a message and generates a corresponding codeword. Modulator 102 subjects the generated codeword to a digital modulation such as BPSK, QPSK or multi-valued QAM and transmits the resulting modulated signal to receiver 12 via channel 103. At receiver 112, demodulator 104 receives the modulated signal from channel 103 and subjects the received modulated signal to a digital demodulation such as BPSK, QPSK or multi-valued QAM. Decoder 30 decodes the resulting representation of the original codeword as described above. Alternatively, receiver 112 could include decoder 31 instead of decoder 30.

The foregoing has described a limited number of embodiments of methods for decoding a representation of a codeword, of decoders that use these methods, of memories whose controllers include such decoders, and of communication systems whose receivers include such decoders. It will be appreciated that many variations, modifications and other applications of the methods, decoders, memories and systems may be made.

What is claimed is:

1. A method of decoding a representation of a codeword that encodes K information bits as N>K codeword bits, the method comprising:
    (a) updating, using a processor, estimates of the codeword bits by steps including, in a graph that includes N bit nodes and N−K check nodes, each bit node being connected to at least one check node by a respective edge, there being E edges in total, exchanging messages between the bit nodes and the check nodes that are so connected to each other; and
    (b) at any time during the exchanging of the messages, storing fewer than E of the messages.

2. The method of claim 1, wherein the estimates of the codeword bits are soft estimates, the method further comprising:
    (c) at any time during the exchanging of the messages, storing fewer than N of the soft estimates of the codeword bits.

3. The method of claim 1, wherein the messages are exchanged according to a belief propagation algorithm.

4. The method of claim 3, wherein the messages are exchanged according to a serial schedule.

5. The method of claim 1, wherein the exchanging is limited to messages exchanged:
    (a) within each of a plurality of sub-graphs of the graph, each sub-graph having a respective number of internal edges; and
    (b) between each sub-graph of the plurality of sub-graphs and at least one external check node;
and wherein, at any time during the exchange of the messages, at most as many messages are stored as there are internal edges in the sub-graph, of the plurality of sub-graphs, that has a largest respective number of internal edges plus edges connecting the sub-graphs of the plurality of sub-graphs to the at least one external check node.

6. The method of claim 5, wherein each sub-graph, of the plurality of sub-graphs, has a respective number of bit nodes; wherein the estimates of the codeword bits are soft estimates; and wherein, at any time during the exchange of the messages, at most as many soft estimates of the codeword bits are stored as there are bit nodes in the sub-graph, of the plurality of sub-graphs, that has a largest respective number of bit nodes.

7. The method of claim 5, wherein, at any time during the exchanging of the messages, the exchanging is limited to messages exchanged:
    (a) within only one of the sub-graphs of the plurality of sub-graphs; and
    (b) between the only one sub-graph of the plurality of sub-graphs and the at least one external check node;
and wherein, while the messages are exchanged within the only one sub-graph of the plurality of sub-graphs and between the only one sub-graph of the plurality of sub-graphs and the at least one external check node, only as many messages are stored as there are internal edges in the only one sub-graph of the plurality of sub-graphs plus edges connecting the sub-graphs of the plurality of sub-graphs to the at least one external check node.

8. The method of claim 7, wherein the estimates of the codeword bits are soft estimates; and wherein, while the messages are exchanged within the only one sub-graph of the plurality of sub-graphs and between the only one sub-graph of the plurality of sub-graphs and the at least one external check node, only as many soft estimates of the codeword bits are stored as there are bit nodes in the only one sub-graph of the plurality of sub-graphs.

9. The method of claim 5, wherein, within each sub-graph of the plurality of sub-graphs, the messages are exchanged according to a belief propagation algorithm.

10. The method of claim 9, wherein, within each sub-graph of the plurality of sub-graphs, the messages are exchanged according to a serial schedule.

11. The method of claim 5, wherein the sub-graphs of the plurality of sub-graphs are disjoint.

12. A decoder for decoding a representation of a codeword that encodes K information bits as N>K codeword bits, comprising:
    (a) a read/write memory; and
    (b) at least one processor for decoding the representation of the codeword by executing an algorithm for updating estimates of the codeword bits by steps including, in a graph that includes N bit nodes and N−K check nodes, each bit node being connected to at least one check node by a respective edge, there being E edges in total, exchanging messages between the bit nodes and the check nodes that are so connected to each other, while storing fewer than E of the messages in the read/write memory at any time during the exchanging of the messages.

13. The decoder of claim 12, comprising a plurality of the processors, and further comprising:
    (c) a routing layer for routing the messages and the estimates of the codeword bits between the processors and the read/write memory in accordance with the graph.

14. The decoder of claim 12, wherein the estimates of the codeword bits are soft estimates, and wherein the read/write memory has sufficient storage capacity, relative to the algorithm, to store a combined total number of
    (i) the messages and
    (ii) the soft estimates of the codeword bits
that is less than N+E.

15. A method of decoding a representation of a codeword that encodes K information bits as N>K codeword bits, the method comprising:
    (a) updating, using a processor, soft estimates of the codeword bits by steps including, in a graph that includes N bit nodes and N–K check nodes, each bit node being connected to at least a portion of the check nodes, exchanging messages between the bit nodes and the check nodes that are so connected; and (b) at any time during the exchanging of the messages, storing fewer than N of the soft estimates of the codeword bits.

16. The method of claim 15, wherein the messages are exchanged according to a belief propagation algorithm.

17. The method of claim 16, wherein the messages are exchanged according to a serial schedule.

18. The method of claim 15, wherein the exchanging is limited to messages exchanged:
(a) within each of a plurality of sub-graphs of the graph, each sub-graph having a respective number of bit nodes; and
(b) between each sub-graph of the plurality of sub-graphs and at least one external check node;

and wherein, at any time during the exchange of the messages, at most as many soft estimates of the codeword bits are stored as there are bit nodes in the sub-graph of the plurality of sub-graphs that has a largest respective number of bit nodes.

19. The method of claim 18, wherein, at any time during the exchanging of the messages, the exchanging is limited to messages exchanged:
(a) within only one of the sub-graphs of the plurality of sub-graphs; and
(b) between the only one sub-graph of the plurality of sub-graphs and the at least one external check node;

and wherein, while the messages are exchanged within the only one sub-graph of the plurality of sub-graphs and between the only one sub-graph of the plurality of sub-graphs and the at least one external check node, only as many soft estimates of the codeword bits are stored as there are bit nodes in the only one sub-graph of the plurality of sub-graphs.

20. The method of claim 18, wherein, within each sub-graph of the plurality of sub-graphs, the messages are exchanged according to a belief propagation algorithm.

21. The method of claim 20, wherein, within each sub-graph of the plurality of sub-graphs, the messages are exchanged according to a serial schedule.

22. The method of claim 18, wherein the sub-graphs of the plurality of sub-graphs are disjoint.

23. A decoder for decoding a representation of a codeword that encodes K information bits as N>K codeword bits, comprising:
(a) a read/write memory; and
(b) at least one processor for decoding the representation of the codeword by updating soft estimates of the codeword bits by steps including executing an algorithm for, in a graph that includes N bit nodes and N–K check nodes, each bit node being connected to at least a portion of the check nodes, exchanging messages between the bit nodes and the check nodes that are so connected, while storing fewer than N of the soft estimates of the codeword bits in the read/write memory at any time during the exchanging of the messages.

24. The decoder of claim 23, comprising a plurality of processors, and further comprising:
(c) a routing layer for routing the messages and the soft estimates of the codeword bits between the processors and the read/write memory in accordance with the graph.

25. The decoder of claim 23, wherein the graph includes E edges connecting the bit nodes and the check nodes between which the messages are exchanged, and wherein the read/write memory has sufficient storage capacity, relative to the algorithm, to store a combined total number of
(i) the messages and
(ii) the soft estimates of the codeword bits
that is less than N+E.

26. A method of decoding a representation of a codeword that encodes K information bits as N>K codeword bits, the method comprising:
(a) updating, using a processor, estimates of the codeword bits by steps including using a parity check matrix to connect a bit vector having N bit vector elements and a check vector having N–K check vector elements, the parity check matrix having E non-zero matrix elements for connecting the bit vector elements and the check vector elements, exchanging messages between the bit vector elements and the check vector elements that are so connected; and
(b) at any time during the exchanging of the messages, storing fewer than E of the messages.

27. The method of claim 26, wherein the estimates of the codeword bits are soft estimates, the method further comprising:
(c) at any time during the exchanging of the messages, storing fewer than N soft estimates of the codeword bits.

28. The method of claim 26, wherein the messages are exchanged according to a belief propagation algorithm.

29. The method of claim 28, wherein the messages are exchanged according to a serial schedule.

30. The method of claim 26, wherein the exchanging is limited to messages exchanged:
(a) according to each of a plurality of sub-matrices of the parity check matrix, each sub-matrix having a respective number of internal non-zero matrix elements; and
(b) between each sub-matrix of the plurality of sub-matrices and at least one external check vector element;

and wherein, at any time during the exchange of the messages, at most as many messages are stored as there are internal non-zero matrix elements in the sub-matrix, of the plurality of sub-matrices, that has a largest respective number of internal non-zero matrix elements plus non-zero-matrix elements of the parity check matrix that connect the sub-matrices of the plurality of sub-matrices to the at least one external check vector element.

31. The method of claim 30, wherein each sub-matrix of the plurality of sub-matrices has associated therewith a respective number of bit vector elements; wherein the estimates of the codeword bits are soft estimates; and wherein, at any time during the exchange of the messages, at most as many soft estimates of the codeword bits are stored as there are bit vector elements associated with the sub-matrix, of the plurality of sub-matrices, that has associated therewith a largest respective number of bit vector elements.

32. A decoder for decoding a representation of a codeword that encodes K information bits as N>K codeword bits, comprising:
(a) a read/write memory; and
(b) at least one processor for decoding the representation of the codeword by executing an algorithm for updating estimates of the codeword bits by steps including using a parity check matrix to connect a bit vector having N bit vector elements and a check vector having N–K check vector elements, the parity check matrix having E non-zero matrix elements for connecting the bit vector elements and the check vector elements, exchanging messages between the bit vector elements and the check vector elements that are so connected, while storing fewer than E of the messages in the read/write memory at any time during the exchanging of the messages.

33. The decoder of claim 32, comprising a plurality of the processors, and further comprising:
(c) a routing layer for routing the messages and the estimates of the codeword bits between the processors and the read/write memory in accordance with the parity check matrix.

34. The decoder of claim 32, wherein the estimates of the codeword bits are soft estimates, and wherein the read/write memory has sufficient storage capacity, relative to the algorithm, to store a combined total number of
(i) the messages and
(ii) the soft estimates of the codeword bits that is less than N+E.

* * * * *

UNITED STATES PATENT AND TRADEMARK OFFICE
CERTIFICATE OF CORRECTION

PATENT NO. : 8,291,279 B2
APPLICATION NO. : 12/124192
DATED : October 16, 2012
INVENTOR(S) : Sharon et al.

It is certified that error appears in the above-identified patent and that said Letters Patent is hereby corrected as shown below:

Column 5,
Line 32, "even tough" should read --even though--.

Column 7,
Line 1, "and (h) at least" should read --and (b) at least--.

Column 8,
Line 25, "(3)" should read --(B)--;
Line 61, "connected is" should read --connected--.

Column 14,
Line 42, "coders" should read --code's--.

Signed and Sealed this
Ninth Day of April, 2013

Teresa Stanek Rea
*Acting Director of the United States Patent and Trademark Office*